(12) United States Patent
Otto et al.

(10) Patent No.: US 6,436,876 B1
(45) Date of Patent: *Aug. 20, 2002

(54) PROCESSING OF OXIDE SUPERCONDUCTORS

(75) Inventors: Alexander Otto, Chelmsford; Gilbert N. Riley, Jr., Marlborough; William L. Carter, Chelmsford, all of MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/861,248

(22) Filed: May 18, 2001

Related U.S. Application Data

(63) Continuation of application No. 09/451,742, filed on Nov. 30, 1999, now Pat. No. 6,284,712, which is a continuation of application No. 08/779,808, filed on Jan. 8, 1997, now Pat. No. 5,994,275, which is a continuation of application No. 08/198,912, filed on Feb. 2, 1997, now Pat. No. 5,661,114, which is a continuation-in-part of application No. 08/041,822, filed on Apr. 1, 1993, now Pat. No. 5,635,456.

(51) Int. Cl.$^7$ .................. C04B 35/64; C04B 35/645
(52) U.S. Cl. .................. 505/501; 505/482; 505/742
(58) Field of Search .................. 505/450, 501, 505/742, 482

(56) References Cited

U.S. PATENT DOCUMENTS

| | | | |
|---|---|---|---|
| 4,885,273 A | 12/1989 | Sugimoto et al. | |
| 4,965,245 A | 10/1990 | Sugimoto et al. | 125/174 |
| 4,973,574 A | 11/1990 | Nishio et al. | |
| 4,975,416 A | 12/1990 | Onishi et al. | |
| 4,992,415 A | 2/1991 | Ashok et al. | |
| 4,994,633 A | 2/1991 | Puhn | |
| 4,999,338 A | 3/1991 | Wijeyesekera et al. | |

(List continued on next page.)

FOREIGN PATENT DOCUMENTS

| | | |
|---|---|---|
| EP | 0 390 499 A2 | 10/1990 |
| EP | 0 496 281 | 7/1992 |
| EP | 0 499 411 A1 | 8/1992 |
| EP | 676.817 | 10/1995 |
| JP | 1-012413 | 1/1989 |
| JP | 1-241708 | 9/1989 |
| JP | 1-241713 | 9/1989 |

(List continued on next page.)

OTHER PUBLICATIONS

Ekin et al., "Effect of acial strain on the critical current of Ag–sheathed Bi–based superconductors in magnetic fields up to 25 T," *Applied Physics Letters 61*, 858–860, 1992.

(List continued on next page.)

*Primary Examiner*—Mark Kopec
(74) *Attorney, Agent, or Firm*—Hale & Dorr LLP

(57) ABSTRACT

A method for preparing a BSCCO-2223 oxide superconducting article includes annealing an oxide superconductor article comprised of BSCCO-2223 oxide superconductor at a temperature selected from the range of about 500° C.$\leq$T$\leq$787° C. and an annealing atmosphere having an oxygen pressure selected from within the region having a lower bound defined by the equation, $P_{O2}(\text{lower}) \geq 3.5 \times 10^{10} \exp(-32,000/T+273)$ and an upper bound defined by the equation, $P_{O2}(\text{upper}) \leq 1.1 \times 10^{12} \exp(-32,000/T+273)$. The article is annealed for a time sufficient to provide at least a 10% increase in critical current density as compared to the critical current density of the pre-anneal oxide superconductor article. An oxide superconductor having the formula $Bi_{2-y}Pb_ySr_2Ca_2Cu_3O_{10+x}$, where $0 \leq x \leq 1.5$ and where $0 \leq y \leq 0.6$ is obtained, the oxide superconductor characterized by a critical transition temperature of greater than 111.0 K, as determined by four point probe method.

18 Claims, 7 Drawing Sheets

U.S. PATENT DOCUMENTS

| | | |
|---|---|---|
| 5,045,527 A | 9/1991 | Ikeno et al. |
| 5,047,391 A | 9/1991 | Bock et al. |
| 5,057,489 A | 10/1991 | Okhawa et al. |
| 5,063,200 A | 11/1991 | Okada et al. .................. 1/505 |
| 5,063,201 A | 11/1991 | Rao et al. |
| 5,068,219 A | 11/1991 | Hagino et al. ................ 599/29 |
| 5,073,679 A | 12/1991 | Bencharab et al. |
| 5,081,075 A | 1/1992 | Jin et al. ....................... 599/29 |
| 5,106,825 A | 4/1992 | Mandigo et al. ............... 1/505 |
| 5,110,789 A | 5/1992 | Yamaguchi et al. .......... 599/29 |
| 5,126,094 A | 6/1992 | Farzin-Nia et al. |
| 5,140,006 A | 8/1992 | Woolf ........................... 1/505 |
| 5,145,829 A | 9/1992 | Asano et al. |
| 5,149,684 A | 9/1992 | Woolf et al. |
| 5,187,859 A | 2/1993 | Heim .......................... 599/29 |
| 5,192,739 A | 3/1993 | Lay |
| 5,204,315 A | 4/1993 | Ito et al. |
| 5,204,316 A | 4/1993 | Arendt et al. |
| 5,208,215 A | 5/1993 | Chen et al. |
| 5,231,366 A | 7/1993 | Haramaki et al. ............. 599/29 |
| 5,246,917 A | 9/1993 | Hikata et al. |
| 5,312,802 A | 5/1994 | Hayashi et al. ............. 125/174 |
| 5,324,712 A | 6/1994 | Su |
| 5,330,969 A | 7/1994 | Finnemore et al. ......... 431/505 |
| 5,369,089 A | 11/1994 | Sato et al. |
| 5,468,566 A | 11/1995 | Dorris et al. |
| 5,531,015 A | 7/1996 | Manlief et al. ............... 599/29 |

FOREIGN PATENT DOCUMENTS

| | | |
|---|---|---|
| JP | 1275434 A | 11/1989 |
| JP | 230617 | 2/1990 |
| JP | 3179788 | 2/1990 |
| JP | 4317415 | 11/1992 |
| JP | 6187849 A | 7/1994 |
| JP | 6325629 A | 11/1994 |
| JP | 6325634 A | 11/1994 |
| JP | 7014443 A | 1/1995 |
| JP | 7045136 A | 2/1995 |
| JP | 7065646 A | 3/1995 |
| NZ | 230404 | 5/1991 |
| WO | WO 93/22799 | 11/1993 |

OTHER PUBLICATIONS

Lcu et al., "Thermostability and decomposition of the $(Bi, Pb)_2Sr_2Ca_2Cu_2O_{10}$ phase in silver–clad tapes," *J. Appl. Phys.* 72, 2385–2389, 1992.

Riley et al., "Ceramic Superconductor Composite Wires," *American Ceramic Society Bulletin* 72, 91–97, 1993.

Sato et al., "High–Jc Silver–Sheathed Bi–Based Superconducting Wires," *IEEE Transactions on Magnetics* 27, 1231–1238, 1991.

Tenbrink et al., "Recent Results on Test Winding and Coils Using B1–2212/Ag HTSC Wires," paper CY–2, ICMC'93, 1993.

"Enhancement of Tc in (Bi,Pb)–2223 superconductor by vacuum encapsulation and post–annealing," Wang et al, Physica C 208,323–327 (1993).

"Fabrication of Ag–Sheathed Bi–Superconding Tapes and Coils" *IEEE Trans. Appl. Supercond.* 5(2) 1267 (1995).

"Effect of a Controlled Melt Process on Phase Transformation and Electromagnetic Properties of BiPbSrCaCuO/Ag Superconducting Wires" *Applied Superconductivity*, 1(1/2):25–31 (1993).

"Microstructure and Critical Current Density of Zone Melt Textured $YBa_2Cu_3O_{6+x}/Y_2BaCuO_5$ with $BaSn_3$ Additions" McGinn et al., *Appl. Phys. Lett.* 59(1), 120–122 (Jul. 1, 1991).

"Incongruent Melting of the High Temperature Superconductor $YBa_2Cu_3O_7$," McCallum et al., *XVII Int. Conf. on Low Temp. Physics*, 1–2 (Aug. 20–26, 1987).

"Investigation of Heat–Treating Conditions for Silver–Sheathed Bi2212 Superconducting Coils" Shibutani et al., *Jpn. J. Appl. Phys.* 30(12A), 3371–3376 (Dec. 1991).

"Critical Current Enhancement in Silver–Clad $Bi_2Sr_2CaCu_2O_x$ Wires Using a Statistical Experimental Design for Heat Treatment Optimization" Bowker, J. and Whitlow, G., *Jpn. J. Appl. Phys.* 32(1), 51–54 (Jan. 1993).

"Effects of Heating Temperature and Atmosphere on Critical Current Density of $Bi_2Sr_2Ca_1Cu_2Ag_{o.s}O_y$ Ag–sheathed Tapes" Endo, A. and Nishikida, S., *IEEE Trans. Appl. Supercond.* 3(1), 931–934 (Mar. 1993).

"Post Sintering Oxygen Pressure Effects on the $J_c$ of BPSC-CO–Silver Clad Tapes" K.W. Lay, *Mat. Res. Soc. Symp. Proc.*, 275, 651–661 (Oct. 26, 1992).

"Fabrication and Critical Current Density of Ag–Sheathed Bi(Pb)(SrCaCuO Superconducting Wires" S.X. Dou, Publication date not known, No Pub Info.

"Growth of the 2223 Phase in Leaded Si–Sr–Ca–Cu Oxide Reduced Oxygen Partial Pressure" Aota et al., *Jap. J. of Appl. Phys* 28(12), L2196–9 (Dec. 1989).

"Critical Issues in the OPIT Processing of High–$J_c$BSCCO Superconductors" Sandhage et al., *J. Mat. Met. Metal.*, 21–25 (Mar. 1991).

"Effect of a Controlled Melt Process on Phase Transformation and Electromagnetic Properties of BiPbSrCaCuO/Ag Superconducting Wires" Guo et al., *Applied Superconductivity* 1(1/2), 25–31 (Jan. 1993).

"Growth of the 2223 Phase in Leaded Bi–Sr–Ca–Cu–O System" Hatano et al., *Jap. J. of Appl. Phys.* 27(11), L2055–L2058 (Nov. 1988(.

"Development of High–$T_c$ Superconductor Wires for Magnet Applications" Tenbrink et al., *IEEE TRans. Mag.* 27(2), 1239–1246 (Mar. 1991).

Phase Diagrams for High $T_c$ Superconductors Ed. John D. Whitler and Robert S. Roth, *The American Ceramic Society*, Westerville, Ohio (1991) (Cover sheet only).

"Growth Mechanism of High $T_c$ Phase in Leaded Bi–Sr–Ca–Cu–O System" Hatano et al., (1990) (Preprint).

"Thermostability and Decomposition of the $(Bi, Pb)_2Sr_2Ca_2Cu_3O_{10}$ Phase in Silver–Clad Tapes" Luo etal.,*J. of Appl. Phys.* 72(6), 2385–2389 (Sep. 1992).

"Kinetics and Mechanism of the $(Bi,Pb)_2Sr_2Ca_2Cu_3O_{10}$ Formation Reaction in Silver–Sheathed Wires" Luo et al., *Appl. Sup.* 1(1/2), 101–107 (Jan. 1993).

"The Effect of Sintering Conditions on the Formation of the High–$T_c$ Phase in the Bi–Sr–Ca–Cu–O System" Kobayashi et al., *Jap. J. Appl. Phys.* 28, L772–L774 (1989).

"Preparation of the Textured Bi–Based Oxide Tapes by Partial Melting Process" Kase et al., *IEEE Trans. Mag.* 27(2), 1254–1257 (Mar. 1991).

Chemical Abstracts, CA 120:141877 (1993); and CA 119:60738 (1992).

Christopherson, et al., "Development of twisted high–temperature superconductor composite conductors", Appl. Phys. Lett., 66(17), pp. 2277–2279, 1995.

Endo, et al., "Composition Dependence on the Superconducting Properties of Bi–Pb–Sr–Ca–Cu–O", Jpn. J. Appl. Phys., 28(2), L190–L192 (Feb. 1992).

Endo, et al., "Preparation of the High–Tc Phase of Bi–Sr–Ca–Cu–O Superconductor", Jpn. J. Appl. Phys., 27(8), L1476–L1479 (Aug. 1988).

Fischer, et al., "Tracking the formation of 2223 Bi Sr Ca Cu Oxygen Compounds", Physica C. 160, pp. 466–470 (1989).

Guo, et al., "Stability of high–Tc phase in Ag–clad Bi–based superconducting wires", Physica C, 200 (3 & 4), pp. 147–154 (Oct. 1992).

Idemoto, et al., "Oxygen Nonstoichiometry of 2223 Phase Bi–Pb–Sr–Ca–Cu–O System Superconducting Oxide", Physica C, 181, pp. 171–178 (1991).

Kishida, et al., "The Preparations of 110K Pb–Doped Bi–Sr–Ca–Cu–O Superconducting Ceramics in Various Oxygen-Reduced Atmospheres", Phys. Stat. Sol., 124, K117 (1991).

Luo, et al., "Phase Chemistry and Microstructure Evolution in Silver–Clad Wires", IEEE Transactions on Applied Superconductivity, 3(1), pp. 972–975, (Conference held on Aug. 23–28, 1992). (Mar., 1994).

Morris, et al., "Oxygen Concentration Effect on Tc of the Bi–Ca–Sr–Cu–O Superconductor", Physical Review B, 39(10), pp. 6612–6614, (Apr. 1989).

Niska, et al., "High–temperature X–ray diffraction of the PbBi–2223 phase superconductor in different atmospheres", Journal of Materials Science Letters, 12(17), pp. 1337–1339, (Sep. 1, 1993).

Ozdas, et al., "Influence of the Hole Concentration of Tc in Intrangrain Effects", Physics and Materials Science of High Temperature Superconductors, II, pp. 381–391 (1992).

Ozdas, et al., "Oxygen intercalation and interfranular coupling", Physical Review B, 48(13), (Oct. 1993).

Rubin, et al., "Phase Stability Limits of $Bi_2Sr_2Ca_1Cu_2O_{8+\Omega}$", Applied Physics Letter, 61, pp. 1977–1979 (1992).

Sato, et al., "Transport current properties of silver–sheathed BiPbSrCaCuO wire and coil", Cryogenics, 31, pp. 687–689 (Jul. 1991).

Sytnikov, et al., "An experimental study of the transport properties of a flexible high–tc superconducting cable", Supercond., Sci. Technol., 7(3), pp. 115–117 (Mar., 1994).

Takada, et al., "Superconductor with Tc=117k in the Bi–P-i–Sr–Ca–Cu–O System" Physica C 170pp. 249–253 (1990).

Ueda, et al., "Design and Testing of a Pair of Current Leads using Bismuth Compound Superconductor", IEEE Transactions on Applied Superconductivity, 3(1), pp. 400–403, (Conference held Aug. 23–28, 1992), (Mar. 1993).

Um, et al., "Influence of Oxygen Deficiency on Electrical Properties", Jpn. J. Appl. Phys., 32 (1.9A), pp. 3799–3803, (Sep. 1993).

Um, et al., "Oxygen Behavior in the Superconductor", Jpn. J. Appl. Phys., 31 (Part 1.3) (pp. 775–779), (Mar. 1992).

Wang, et al., "Effect of Post–annealing on Tc in Pb–doped Bi–2223 Superconductors", Advances in Superconductivity V: Proceedings of the $5^{th}$ International Symposium on Superconductivity, pp. 291–294 (Nov. 1992).

Yasuda, et al., "Heat Treatments After High Temperature Deformation in BPSCCO Sintered Specimens", Advances in Superconductivity V, Proceedings of the $5^{th}$ International Symposium on Superconductivity (ISS '92) (Nov. 16–19, 1992, Springer–Verlag, 1993, pp. 623–626).

Zhu, et al., "The influence of oxygen partial pressure and temperature on Bi–Pb–Sr–Ca–Cu–O 110 K superconductor phase formation and its stability", J. Appl. Phys., 73(12) (Jun. 15, 1993), pp. 8423–8428.

PROCESSING OF OXIDE SUPERCONDUCTORS

This application is a continuation of and claims priority to U.S. Ser. No. 09/451,742, filed Nov. 30, 1999 now U.S. Pat. No. 6,284,712, which is a continuation of U.S. Ser. No. 08/779,808, file Jan. 8, 1997, now U.S. Pat. No. 5,994,275, which is a continuation of U.S. Ser. No. 08/198,912, filed Feb. 2, 1997, now U.S. Pat. No. 5,661,114, which is a continuation in part of U.S. Ser. No. 08/041,822 filed Apr. 1, 1993, now U.S. Pat. No. 5,635,456, the entirety of which are incorporated by reference.

FIELD OF THE INVENTION

The present invention relates to high-performance oxide superconductors and oxide superconductor composites. The present invention further relates to a method for healing defects introduced into the oxide superconductor phase during processing thereby improving superconducting properties. The present invention also relates to the processing of high performance bismuth-strontium-calcium-copper oxide superconductors and oxide superconductor composites and a method for improving the critical transition temperature ($T_c$ and critical current density ($J_c$) of these oxide superconductors.

BACKGROUND OF THE INVENTION

Oxide superconductors of the rare earth-barium-copper-oxide family (YBCO), bismuth(lead)-strontium-calcium-copper-oxide family ((Bi,Pb)SCCO) and thallium-barium-calcium-copper-oxide family (TBCCO) form plate-like and highly anisotropic superconducting oxide grains. Because of their plate-like morphology, the oxide grains can be oriented by mechanical strain. Mechanical deformation has been used to induce grain alignment of the oxide superconductor c-axis perpendicular to the plane or direction of elongation. The degree of alignment of the oxide superconductor grains is a major factor in the high critical current densities ($J_c$) obtained in articles prepared from these materials.

Known processing methods for obtaining textured oxide superconductor composite articles include an iterative process of alternating heating and deformation steps. The heat treatment is used to promote reaction-induced texture of the oxide superconductor in which the anisotropic growth of the superconducting grains is enhanced. Each deformation provides an incremental improvement in the orientation of the oxide grains. Additional heat treatment intermediate with or subsequent to deformation is also required to form the correct oxide superconductor phase, promote good grain interconnectivity and achieve proper oxygenation.

Processing long lengths of oxide superconductor is particularly difficult because deformation leads to microcracking and other defects which may not be healed in the subsequent heat treatment. Cracks that occur perpendicular to the direction of current flow limit the performance of the superconductor. In order to optimize the current carrying capability of the oxide superconductor, it is necessary to heal any microcracks that are formed during processing of the oxide superconductor or superconducting composite.

Liquid phases in co-existence with solid oxide phases have been used in processing of oxide superconductors. One type of partial melting, known as peritectic decomposition, takes advantage of liquid phases which form at peritectic points of the phase diagram containing the oxide superconductor. During peritectic decomposition, the oxide superconductor remains a solid until the peritectic temperature is reached, at which point the oxide superconductor decomposes into a liquid phase and a new solid phase. The peritectic decompositions of $Bi_2Sr_2CaCu_2O_{8+x}$, (BSCCO-2212, where $0 \leq x \leq 1.5$), into an alkaline earth oxide and a liquid phase and of $YBa_2Cu_3O_{7-\delta}$, (YBCO-123, where $0 \leq \delta \leq 1.0$) into $Y_2BaCuO_5$ and a liquid phase are well known.

Peritectic decomposition of an oxide superconductor and the reformation of the oxide superconductor from the liquid + solid phase is the basis for melt textured growth of YBCO-123 and BSCCO-2212. For example, Kase et al. in *IEEE Trans. Mag.* 27(2), 1254 (MarCu 1991) report obtaining highly textured BSCCO-2212 by slowly cooling through the peritectic point. This process necessarily involves total decomposition of the desired 2212 phase into an alkaline earth oxide and a liquid phase.

It is also recognized that an oxide superconductor itself can co-exist with a liquid phase under suitable processing conditions. This may occur by solid solution melting, eutectic melting or by formation of non-eqilibrium liquids.

Solid solution melting may arise in a phase system, in which the oxide superconductor is a solid solution. As the temperature (or some other controlling parameter) of the system increases (or decreases), the oxide superconductor phase changes from a solid oxide phase to a liquid plus oxide superconductor partial melt (this happens at the solidus). A further increase in temperature (or some other controlling parameter) affords the complete melting of the oxide superconductor (this happens at the liquidus).

A phase diagram containing a eutectic point may provide an oxide superconductor partial melt, known as eutectic melting, when the overall composition is chosen so as to be slightly off stoichiometry. As the temperature (or some other controlling parameter) of the system increases (or decreases), the mixed phase of oxide superconductor-plus-non-superconducting oxide ($solid_1+solid_2$) changes to a liquid-plus-oxide superconductor partial melt ($solid_1$+liquid).

Non-equilibrium liquids may also promote partial melting in oxide superconductor systems. A non-equilibrium liquid is established through the relatively rapid heating of a mixture of oxides to a temperature above the eutectic melting point of local stoichiometries present in the heterogeneous mixture of phases. As the oxides form the desired oxide superconductor, the solid and liquid phases can co-exist, if only temporarily.

Partial melting of $(Bi,Pb)_2Sr_2Ca_2Cu_3O_{10+x}$ ((Bi,Pb)SCCO-2223, where $0 \leq x \leq 1.5$) and $(Bi)_2Sr_2Ca_1$, $Cu_2O_{10+x}$ ((Bi)SCCO-2223, where $0 \leq x \leq 1.5$), 25 BSCCO-2223, at temperatures above 870° C. in air has been reported; see, for example, Kobayashi et al. *Jap. J. Appl. Phys.* 28, L722–L744 (1989), Hatano et al. Ibid. 27(11), L2055 (Nov. 1988), Luo et al. *Appl. Super.* 1, 101–107, (1993), Aota et al. *Jap. J. Appl. Phys.* 28, L2196–L2199 (1989) and Luo er al. *J. Appl. Phys.* 72, 2385–2389 (1992). The exact mechanism of partial melting of BSCCO-2223 has not been definitively established.

Guo et al. in *Appl. Supercond.* 1(1/2), 25 (January 1993) have described a phase formation-decomposition-reformation (PFDR) process, in which a pressed sample of (Bi,Pb)SCCO-2223 is heated above its liquidus to decompose the 2223 phase, followed by a heat treatment at a temperature below the solidus. The sample was subsequently pressed again and reannealed. The final anneal of the PFDR process includes a standard single step heat treatment in which there is no melting.

The "high $T_c$" oxide superconductor $Bi_{2-y}Pb_ySr_2Ca_2Cu_{10+x}$, where $0 \leq x \leq 1.5$ and $0 \leq y \leq 0.6$ (BSCCO-2223 and (Bi, Pb)SCCO-2223, hereinafter referred to as "BSCCO-2223" to indicate both lead-doped and undoped compositions), is particularly desirable because of its high critical transition temperature ($T_c$~110 K) and high critical current ($I_c$, $J_c$). The superconducting art constantly seeks to improve electrical properties, such as, critical current density and critical transition temperature.

Partial melting in the processing of oxide superconductors has been used either to increase the yield of the BSCCO-2223 phase or to improve the contiguity and texturing of the oxide superconductor grains. The issue of healing defects, such as microcracks, which develop during processing of the oxide superconductor, has not been addressed. Further, the prior art has not addressed the possibility of using a two-step process where the oxide superconductor is stable in both steps for the healing of cracks and defects.

Wang et al. ("Advances in Superconductivity", Springer-Verlag, New York, Editors: Y. Bando and H. Yamauchi, pp. 291–294(1993)) report an increase in $T_c$ by carrying out a post-anneal step at 790° C. at reduced total pressures. Wang et al. observed $T_c$ by DC magnetization of 115 K and $T_{c,zero}$ of 111 K by resistivity measurement. The technique used by Wang et al. (vacuum encapsulation at 104 Torr of oxide superconductor pellets, followed by annealing at 790° C.) does not permit determination of the oxygen pressure of the system. The encapsulated pellets reach an equilibrium oxygen pressure within the capsule by releasing oxygen. The pellet volume/capsule volume plays an important role in determining the final equilibrium oxygen pressure.

Critical transition temperatures (determined by magnetization) as high as 117 K have been reported for multiphase materials containing BSCCO-2223. Fisher et al. (*Physica C* 160, 466 (1990)) reported a $T_c$ of 115 K (determined by magnetization) with the substitution of lead and antimony in the BSCCO-2223 system. A non-reproducible $T_c$ as high as 130 K was reported by Hongbo et al. (*Solid State Comm.* 69, 867 (1989)).

While reports of high transition temperatures by magnetization studies are of interest, they can sometimes be misleading. The transition curves obtained by magnetization are "soft", making extrapolation to zero resistivity highly subjective. Further, other effects, such as semiconductor to metallic transitions, can mimic critical temperature transition behavior. It is therefore desirable to rely on bulk resistivity measurements for determining temperature at zero resistivity ($T_{c,\,zero}$).

Idemoto et al. (*Physica C* 181, 171–178 (1991)) has investigated the oxygen content and copper and bismuth valances of BSCCO-2223 under a range of conditions, including temperatures in the range of 500° C. to 850° C. and oxygen pressures in the range of 0.005 to 0.20 atm. The samples were observed by means of a microbalance under changing temperatures conditions at constant oxygen pressures. Because the samples do not reach equilibrium during the observation period, it is difficult to determine the exact processing conditions experienced by the samples. No investigation of the effect of reported conditions on electrical properties is reported.

None of the previous research has indicated the desirability of post-annealing the BSCCO-2223 phase at low temperatures and oxygen pressures to enhance the electric transport properties of the oxide superconductor, namely critical current.

It is the object of the present invention to provide a method for improving superconducting performance of oxide superconductors and superconducting composites by healing cracks and defects formed during processing of oxide superconductors and superconducting composites.

It is a further object of the invention to prepare oxide superconducting articles having significantly less cracks and defects than conventionally-processed articles.

A further object of the present invention is to provide a process to increase the critical current density of BSCCO-2223 by a method which also increases its critical transition temperature. It is a further object of the present invention to provide a novel high-$T_c$ BSCCO-2223 composition having a critical transition temperature greater than 111.0 K.

A feature of the invention is a two-step heat treatment after which no further deformation occurs which introduces a small amount of a liquid phase co-existing with the oxide superconductor phase, and then transforms the liquid back into the oxide superconductor phase with no deformation occurring during or after the heat treatment of the invention. A further feature of the present invention is a low temperature, low oxygen pressure anneal of the oxide superconductor.

An advantage of the invention is the production of highly defect-free oxide superconductor and superconducting composites which exhibit superior critical current densities. A further advantage of the invention is a marked improvement in critical transition temperature and critical current density as compared to oxide superconductors and superconducting composites which are not subjected to the method of the invention.

SUMMARY OF THE INVENTION

In one aspect of the present invention, an oxide superconductor article containing a desired oxide superconductor phase is exposed to a two-step heat treatment after deformation of the article, which includes (a) heating the article at a temperature sufficient to partially melt the article, such that a liquid phase co-exists with the desired oxide superconductor phase; and (b) cooling the article to a temperature sufficient to transform the liquid phase into the desired oxide superconductor, with no deformation occurring after the heat treatment of the invention.

In another aspect of the invention, an oxide superconductor article containing a desired oxide superconductor phase is exposed to a two-step heat treatment after deformation of the article which includes (a) forming a liquid phase in the oxide superconducting( article, such that the liquid phase co-exists with the desired oxide superconductor solid phase; and then (b) transforming the liquid phase into the desired oxide superconductor, with no deformation occurring after the heat treatment of the invention.

In preferred embodiments, the liquid phase wets surfaces of defects contained within the oxide superconductor article. The defects are healed upon transformation of the liquid to the desired oxide superconductor. The partial melting of step (a) and the transformation of step (b) are effected by selection of appropriate thermodynamic state variables, for example, temperature, $P_{O2}$, $P_{total}$ and total composition. In principle, deformation may occur during the heat treatment of the present invention up to immediately prior to the completion of step (a), providing that the liquid phase is available for a period of time sufficient to wet defect surfaces.

By "two-step heat treatment" or "heat treatment of the invention", as those terms are used herein, it is meant a heat treatment for forming an oxide superconductor after which no further deformation occurs. However, heat treatments for purposes other than those stated herein, such as, for example, oxygenation of the oxide superconductor, are possible. In all cases, not further deformation occurs.

By "partial melt", as that term is used herein, it is meant the oxide superconductor article is only partially melted, and that the desired oxide superconductor is present during melting.

By "deformation" as that term is used herein, it is meant a process which causes a change in the cross-sectional shape of the article.

By "oxide superconductor precursor", as that term is used herein, it is meant any material that can be converted to an oxide superconductor upon application of a suitable heat treatment. Suitable precursor materials include but are not limited to metal salts, simple metal oxides, complex mixed metal oxides and intermediate oxide superconductors to the desired oxide superconductor.

By "desired oxide superconductor", as that term is used herein, it is meant the oxide superconductor which it is desired to ultimately prepare. An oxide superconductor is typically the "desired" oxide superconductor because of superior electrical properties, such as high $T_c$ and/or $J_c$. The desired oxide superconductor is typically a high $T_c$ member of a particular oxide superconductor family, i.e., BSCCO-2223, YBCO-123, TBCCO-1212 and TBCCO-1223.

By "intermediate oxide superconductor", as that term is used herein, it is meant an oxide superconductor which is capable of being converted into a desired oxide superconductor. However, an intermediate oxide superconductor may have desirable processing properties, which warrants its formation initially before final conversion into the desired oxide superconductor. The formation of an "intermediate oxide superconductor" may be desired, particularly during heat treatment/deformation iterations, where the intermediate oxides are more amenable to texturing than the desired oxide superconductor.

In yet another aspect of the present invention, a textured oxide superconductor article is prepared by subjecting an article containing an oxide superconductor precursor to at least one first heat treatment/deformation iteration. The heat treatment is effective to form a desired oxide superconductor. The resultant oxide superconductor phase is textured upon application of the first heat treatment/deformation iteration. The article is then exposed to a two-step heat treatment in which (a) the article is partially melted, such that a liquid phase co-exists with the desired textured oxide superconductor phase; and (b) the liquid phase is transformed into the desired oxide superconductor, with no deformation occurring after the heat treatment of the invention.

In yet another aspect of the present invention, a textured oxide superconductor article is prepared by subjecting an article containing an oxide superconductor precursor to at least one first heat treatment/deformation iteration. The heat treatment is effective to form an intermediate oxide superconductor. The intermediate textured oxide superconductor phase is formed. The article is then subjected to at least one second heat treatment/deformation iteration. The heat treatment is effective to form a desired oxide superconductor. The desired textured oxide superconductor is formed. The article is then exposed to a two-step heat treatment in which (a) the article is partially melted, such that a liquid phase co-exists with the desired textured oxide superconductor phase; and (b) the liquid phase is transformed into the desired oxide superconductor, with no deformation occurring after the heat treatment of the invention.

In preferred embodiments, the intermediate oxide superconductor is BSCCO-2212 or (Bi,Pb)SCCO-2212 because it is readily textured by the heat treatment/deformation iterations. The intermediate oxide superconductor is then converted to a desired oxide superconducting phase, typically BSCCO-2223 or (Bi,Pb)SCCO-2223. The partial melting of step (a) may be carried out at a temperature in the range of 820–835° C. at 0.075 atm $O_2$. The transformation of the liquid in step (b) may be carried out at a temperature in the range of 790–820° C. at 0.075 atm $O_2$. In other preferred embodiments, the desired oxide superconductor, may be YBCO-123, $Y_2Ba_4Cu_7O_{14-\delta}$ (YBCO-247), $(Tl,Pb),Ba_2Ca_1,Cu_2O_{6.0\pm y}$ (TBCCO-1212) or $(Tl,Pb),Ba_2Ca_2Cu_3O_{8.0\pm y}$ (TBCCO-1223), where $0 \leq \delta \leq 1.0$ and y ranges up to 0.5. The stated stoichiometries are all approximate and intentional or unintentional variations in composition are contemplated within the scope of the invention.

In other preferred embodiments, the liquid phase is formed in the range of 0.1–30 vol %. In yet other preferred embodiments, the heat treatment of the first and second heat treatment/deformation iterations partially melts the oxide superconductor article.

In yet another aspect of the invention, an oxide superconductor article is exposed to a two-step heat treatment after a deformation step, which includes (a) heating the article at a temperature substantially in the range of 810–860° C. for a period of time substantially in the range of 0.1 to 300 hours at a $P_{O2}$ substantially in the range of 0.001–1.0 atm; and (b) cooling the article to a temperature substantially in the range of 780–845° C. for a period of time substantially in the range of 1 to 300 hours at a $P_{O2}$ substantially in the range of 0.001–1.0 atm, with no deformation occurring after the heat treatment of the present invention.

In yet another aspect of the present invention, an oxide superconductor article containing a desired oxide superconductor phase is exposed to a two-step heat treatment after a deformation step, which includes (a) subjecting the article to an oxygen partial pressure sufficient to partially melt the oxide superconducting article, such that a liquid phase co-exists with the desired oxide superconductor; and (b) raising to an oxygen partial pressure sufficient to transform the liquid phase into the desired oxide superconductor.

Yet another aspect of the present invention provides for a multifilamentary oxide superconductor composite containing a plurality of oxide superconductor filaments contained within a matrix material which has been subjected to the two-step heat treatment of the invention.

In yet another aspect of the invention, a multifilamentary oxide superconductor composite contains a plurality of oxide superconductor filaments contained within a matrix material, the composite having a $J_c$ of at least $14 \times 10^3$ A/cm$^2$ at 77K, self field, as measured over a length of at least 50 m.

The present invention provides oxide superconductors which exhibit marked improvement in critical current density ($J_c$) over samples processed in an otherwise similar manner, lacking only the two-step heat treatment of the present invention.

In yet another aspect of the present invention, a BSCCO-2223 oxide superconducting article is prepared by providing an oxide superconductor article including BSCCO-2223 oxide superconductor, and annealing the superconducting article at a temperature selected from the range of about 500° C.$\leq T \leq$787° C. and an annealing atmosphere having an oxygen pressure selected from within the region having a lower bound defined by the equation, $P_{O2}(lower) \geq 3.5 \times$ $10^{10}\exp(-32,000/(T+273))$ and an upper bound defined by the equation, $P_{O2}(\text{upper}) \leq 1.1 \times 10^{10}\exp(-32,000/(T+273))$. The sample is annealed for a time sufficient to provide at least a 10% increase in critical current density as compared to the critical current density of the pre-anneal oxide superconductor article.

In yet another aspect of the invention, a BSCCO-2223 oxide superconducting article is prepared by providing an oxide superconductor article including BSCCO-2223 oxide superconductor, and annealing the superconducting article at a temperature selected from the range of about $500°$ C. $\leq T \leq 760°$ C. and an annealing atmosphere having an oxygen pressure selected from within the region having a lower bound defined by the equation, $P_{O2}(\text{lower}) \geq 8.5 \times 10^{10}\exp(-32,000/(T+273))$ and an upper bound defined by the equation, $P_{O2}(\text{upper}) \leq 2.62 \times 10^{11}\exp(-32,000/(T+273))$. The sample is annealed for a time sufficient to provide at last a 10% increase in critical current density as compared to the critical current density of the pre-anneal oxide superconductor article.

In yet another aspect of the invention, a BSCCO-2223 oxide superconductor article is prepared by exposing the article including at least BSCCO-2223 to a heat treatment after deformation of the article, including (a) heating the article at a temperature substantially in the range of $815–860°$ C. for a period of time substantially in the range of 0.1 to 300 hours at a $P_{O2}$ substantially in the range of 0.001–1.0 atm; and (b) subjecting the article to a temperature substantially in the range of $790–845°$ C. for a period of time substantially in the range of 1 to 300 hours at a $P_{O2}$ substantially in the range of 0.01–1.0 atm, with no deformation occurring after the heat treatment. The superconducting article is then annealed at a temperature selected from the range of about $500°$ C.$\leq T \leq 787°$ C. and an annealing atmosphere having an oxygen pressure selected from within the region having a lower bound defined by the equation, $P_{O2}(\text{lower}) \geq 3.5 \times 10^{10} \exp(-32,000/(T+273))$ and an upper bound defined by the equation, $P_{O2}(\text{upper}) \leq 1.1 \times 10^{12}\exp(-32,000/(T+273))$.

By "anneal of the present invention", it is meant a low pressure, low temperature heat treatment under equilibrium conditions during which no further formation of the desired oxide superconducting phase occurs; however, the internal chemistry of the oxide superconductor (i.e.; oxygen stoichiometry) and grain growth of the existing oxide superconductor phase may be affected.

In preferred embodiments, the annealing atmosphere is substantially at a pressure of one atmosphere and oxygen pressure is obtained by controlling the oxygen concentration in the annealing atmosphere. The annealing atmosphere may additionally contain an inert gas selected from the group consisting of argon, nitrogen and helium. The anneal is carried out at an oxygen pressure substantially in the range of $7.5 \times 10^{-2}$ atm to $1 \times 10^{-8}$ atm $O_2$. The annealing of the invention is preferably the final annealing to which the superconducting article is subjected.

In other preferred embodiments, the anneal is carried out at a the temperature in the range of 770 to $787°$ C. and an oxygen pressure in the range of 0.017 to 0.085 atm; The anneal is carried out at a temperature in the range of 750 to $770°$ C. and an oxygen pressure in the range of 0.0009 to 0.052 atm; the method of claim 1, 2 or 3, wherein the anneal is carried out at a temperature in the range of 730 to $750°$ C. and an oxygen pressure in the range of 0.005 to 0.029 atm; the anneal is carried out at a temperature in the range of 690 to $730°$ C. and an oxygen pressure in the range of 0.0001–0.015 atm; the anneal is carried out at a temperature in the range of 740 to $760°$ C. and an oxygen pressure in the range of 0.0016 to 0.009 atm; the anneal is carried out at a temperature in the range of 710 to $740°$ C. and an oxygen pressure in the range of 0.0006–0.005 atm; and the anneal is carried out at a temperature in the range of 690 to $710°$ C. and an oxygen pressure in the range of 0.0003–0.002 atm.

In yet other preferred embodiments, sample is annealed at progressively lower temperature and oxygen pressure. This may be accomplished by continuously reducing temperature and/or oxygen pressure or by stepwise reduction of temperature and/or oxygen pressure.

Yet another aspect of the invention includes a superconductor having the formula $Bi_{2-y}Pb_ySr_2Ca_2Cu_3O_{10+x}$, where $0 \leq x \leq 1.5$ and where $0 \leq y \leq 0.6$, the oxide superconductor characterized by a critical transition temperature of greater than 111.0 K as defined by zero resistance by a four point linear probe method with zero resistance corresponding to a resistivity of less than $108^{-8}$ $\Omega$-cm. An article containing the oxide superconductor may additionally include silver.

Yet another aspect of the invention includes an oxide superconductor article characterized by a critical transition temperature of greater than 111.0 K as defined by zero resistance by a four point linear probe method with zero resistance corresponding to a resistivity of less than $10^{-8}$ $\Omega$-cm and an x-ray diffraction pattern having peaks at $17.4°$, $19.2°$, $20.2°$, $21.8°$, $23.2°$, $23.9°$, $26.2°$, $27.8°$, $29°$, $29.7°$, $31.5°$, $32°$, $33.2°$, $33.7°$, $35°$, $35.6°$, $38°$, $38.8°$, $41.6°$, $43.8°$, $44.4°$, $46.8°$, $47.4°$, $48°$ and $49°$.

Yet another aspect of the present invention provides for a multifilamentary oxide superconductor composite containing a plurality of oxide superconductor filaments contained within a matrix material which has been subjected to an anneal according to the present invention.

The oxide superconductor prepared according to the method of this invention exhibit superior electric transport properties and enhanced $T_c$.

DESCRIPTION OF THE PREFERRED EMBODIMENT

I. TWO-STEP HEAT TREATMENT

The present invention is a method for improving the critical current density of oxide superconductor articles by healing defects, such as micro- and macrocracks, incurred upon deformation. The present invention calls for a final two-step treatment after deformation of the oxide superconductor article, in which (a) a liquid phase is formed such that the liquid phase co-exists with the desired oxide superconductor; and (b) the liquid phase is then transformed into the desired oxide superconductor without any intermediate deformation. The methods of the invention can be used to heal defects in any oxide superconductor or superconducting composite as long as a liquid phase can co-exist with the desired oxide superconductor phase. It is recognized, that complete transformation of the liquid to the oxide superconductor occurs under ideal conditions and that, under some circumstances, not all of the liquid may be transformed into the desired oxide superconductor.

The liquid phase is formed upon partial melting of the oxide superconductor article. During partial melting of the article, non-superconducting materials and intermediate oxide phases may be present with the desired oxide superconductor phase. During the partial melting step of the invention the desired oxide superconductor, the non-superconducting materials, oxide superconducting precursors, the desired oxide superconductor or a mixture of these components may melt to form the liquid phase.

The above process, which required that liquid co-exist with the desired oxide superconductor phase, is distinguished from those which involve the peritectic decomposition of the oxide superconductor, such as described by Guo et al. and Kase et al., in which the desired oxide superconductor decomposes during the melting process.

Figure 1:
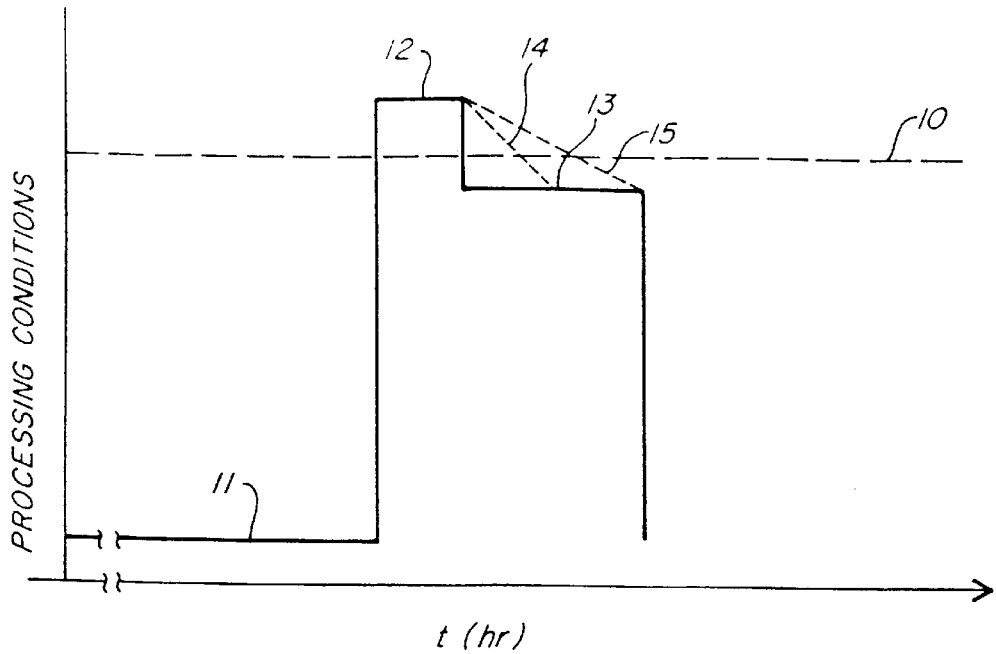
FIG. 1 is a processing profile of the two-step heat treatment of the invention.

FIG. 1 shows a processing profile of the final heat treatment of the invention. A dashed line 10 indicates a processing point at which a liquid phase is formed for a given set of processing conditions, e.g., T, $P_{O2}$, $P_{total}$ and/or oxide composition.

In the oxide superconductors and superconducting composites disclosed herein, processing conditions for obtaining the requisite liquid and solid oxide phases are well established and the relationship between temperature, oxygen partial pressure and total pressure is reasonably well understood. For further information on the phase diagrams for YBCO, BSCCO and the thallium-based systems, the interested reader is directed to "Phase Diagrams for High $T_c$, Superconductors", John D. whitler and Robert S. Roth, Ed.; American Ceramic Society, Westerville, Ohio.

Presence of a liquid phase can also be determined experimentally by use of such conventional techniques as differential thermal analysis (DTA). In DTA, exothermic and endothermic reactions as a function of temperature can be identified and attributed to various thermodynamic and chemical processes. It is possible to identify endothermic processes corresponding to partial melting; i.e. liquid phase formation.

It is desired that only a small amount of liquid be formed during partial melting. The reason for this is that, at the time that the final heat treatment is applied, the article substantially is already textured. Complete or significant liquid formation at this point would result in loss of texture. Volume percent of the liquid phase is typically in the range of 0.1 to 30.

The oxide superconductor is deformed at a point 11 before the final heat treatment, at which time defects such as microcracks may be introduced into the article. Suitable deformation can include swaging, extruding, drawing, pressing, hot and cold isostatic pressing, rolling, and forging of wires, tapes and a variety of shaped articles.

Figure 2A:
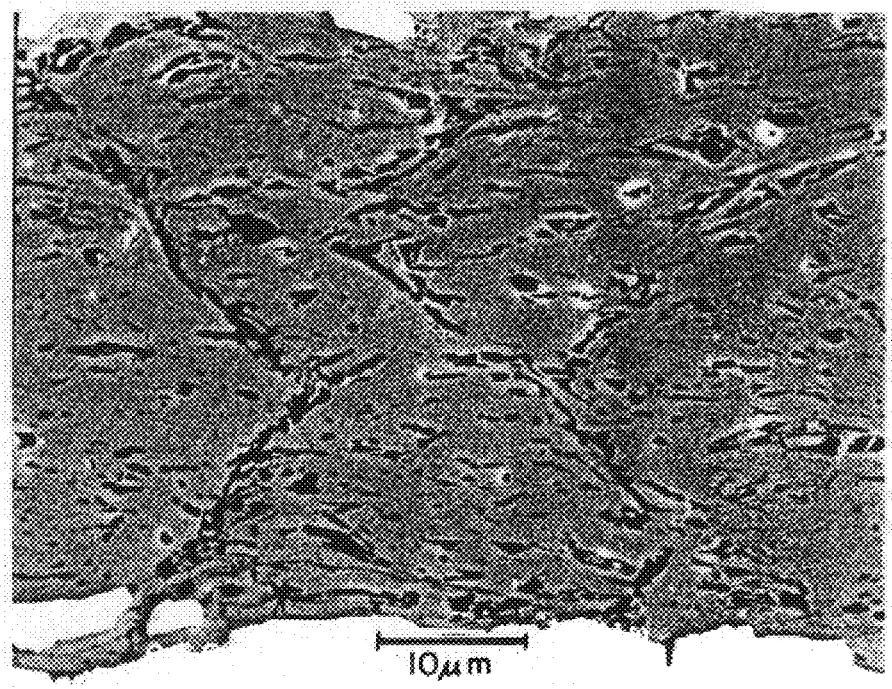
FIG. 2 is an optical photomicrograph of (a) a pressed oxide superconductor article without the two step heat treatment of the invention, and (b) a pressed oxide superconductor article subjected to the heat treatment of the invention.
Figure 2B:
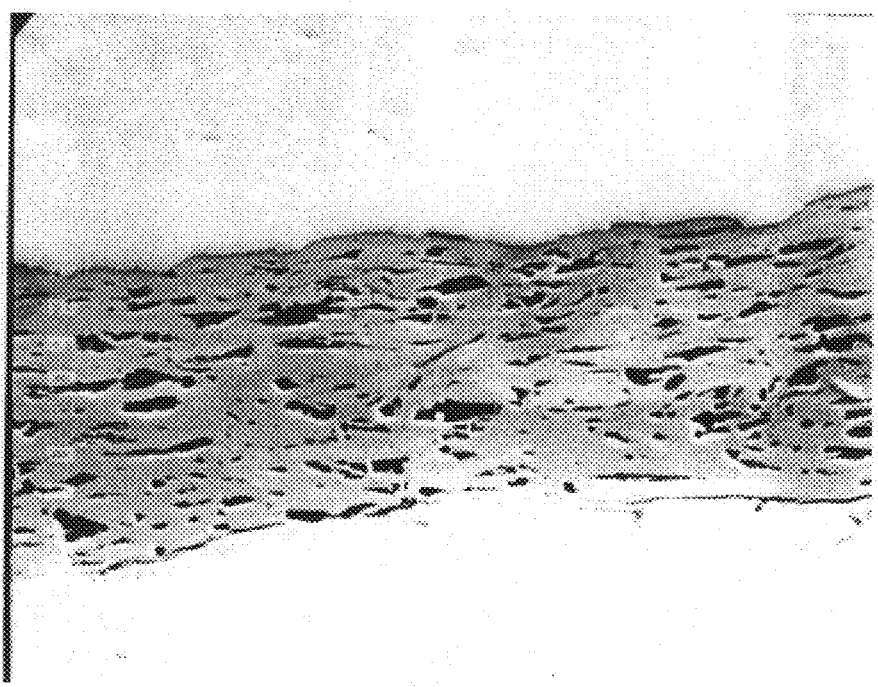

The method of the invention is particularly useful for oxide superconductor articles in which deformation processing introduces defects perpendicular to the direction of current flow. In rolling, the deformation is largely plane strain, that is, extension in the length of the article entirely compensates for the reduction in thickness resulting in cracking in the transverse direction and perpendicular to the current flow. FIG. 2a shows an optical photomicrograph of a pressed oxide superconductor filament without the final heat treatment of the invention. Many fine cracks are visible and clearly disrupt the percolative pathway for current flow. It is expected therefore, that rolled samples will benefit to a greater extent from the final heat treatment of the invention.

Other deformation processes, such as pressing, results in reduction of the article thickness accommodated by lateral spread, i.e., an increase in width. Cracks in this case form parallel to the current flow. While defects of this type, can be healed by the final heat treatment of the invention, the improvement to the electrical properties may not be as marked.

Referring again to FIG. 1, the processing conditions are adjusted to bring the article to point 12 where the article is partially melted and a liquid phase co-exists with the desired oxide superconductor phase. The article is held at point 12 for a period of time during which the defect surfaces contained within the oxide superconductor are wet by the newly-formed liquid. In the case of BSCCO-2223, a temperature of 820–835° C. at 0.075 atm $O_2$ for 0.1–300 hours is sufficient. The processing parameters are then adjusted to bring the oxide superconductor to point 13 where the liquid phase is consumed and the desired oxide superconductor phase is formed from the melt. In the case of BSCCO-2223, a temperature of 820–790° C. at 0.075 atm $O_2$ for 1 to 300 hours is sufficient.

The final heat treatment includes heating the article at a temperature of substantially in the range of 815° C. to 860° C. for a period of time substantially in the range of 0.1 to 300 h at a $P_{O2}$ substantially in the range of 0.001–1.0 atm. The processing temperature will vary dependent upon the oxygen pressure. Additionally, variations in the chemical composition of the article will also affect selection of temperature and pressure. In particular, it has been noted that addition of silver to the oxide composition lowers the temperature range for partial melting, particularly at higher $P_{O2}$ (0.1–1.0 atm).

Hence, the two-step heat treatment heals cracks and other defects while effecting the final conversion of the oxide phases to the desired oxide superconductor phase. The formation of BSCCO-2223 from BSCCO-2212 is kinetically enhanced by the presence of the liquid phase, in part, due to the enhanced diffusivity of the oxide superconductor constituents. The partial melting during the final part of the process can perform two tasks. Firstly, the cracks formed during the prior deformation steps are healed by rapid growth of the oxide superconductor grains at the crack site. Secondly, the conversion rate of 2212 to 2223 is greatly accelerated, allowing the formation of a microscopically crack-free, interconnected 2223 phase.

Various processing parameters can be controlled to obtain the necessary partial melt and oxide reforming steps. For example, $P_{O2}$ can be held constant and temperature can be raised to promote melting and formation of the liquid phase and lowered to regenerate the desired oxide superconductor. Alternatively, temperature can be held constant, and $P_{O2}$ can be lowered to promote the partial melting of the oxide superconductor article and raised to reform the oxide superconductor.

The processing conditions can be changed rapidly from point 12 to point 13 of the process (fast ramp rate). Alternatively, the oxide superconductor can be subjected to gradually changing conditions (of temperature or pressure) between point 12 and point 13 of the process designated by the curve 14 in FIG. 1 (slow ramp rate). In another alternative embodiment, there need be no "hold" at 13. The processing conditions can be slowly ramped from the processing conditions defined at point 12 to the processing conditions defined for point 13. This process is illustrated by curve 15 in FIG. 1.

The method of forming textured oxide superconducting articles is described with reference to oxides of the BSCCO family; however, this is in no way meant to limit the scope of the invention. The present invention can be practiced with any oxide superconductor system in which a liquid phase co-exists with an oxide superconductor phase and which is amenable to deformation-induced texture.

Texture may be induced by reaction conditions and/or deformation. In reaction-induced texture, processing conditions are chosen to kinetically favor the anisotropic growth of oxide superconductor grains. Reaction-induced texture can occur in a solid phase system or, preferably, in a solid-plus-liquid phase system. The presence of a liquid phase enhances the kinetics of anisotropic grain growth, probably through increased rates of diffusion of the oxide components. In deformation-induced texture, a strain is applied to the superconducting article to induce alignment of the oxide grains in the plane or direction of elongation. Deformation-induced texture requires aspected grains or an anisotropic rheology in order to effect a preferential alignment of the grains.

Figure 3:
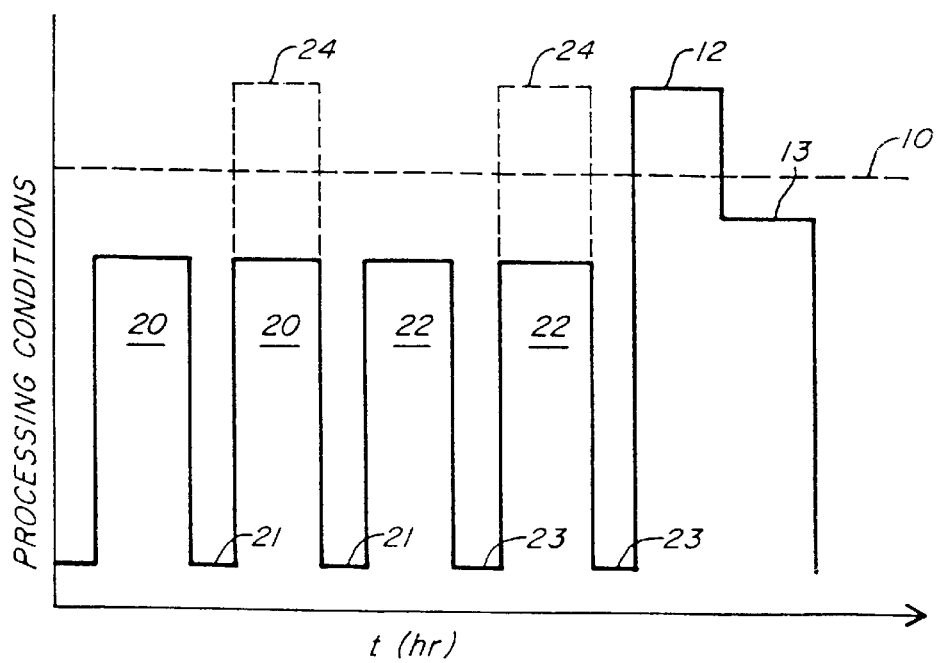
FIG. 3 is a processing profile used to obtain an textured oxide superconductor according to the method including the two-step heat treatment of the invention.

FIG. 3 shows a processing profile for a method of the invention used to obtain highly textured oxide superconductor articles. The general process for the formation of a textured oxide superconductor may consist of three distinct steps.

In a first step, an oxide superconductor precursor is subjected to one or more first heat treatment/deformation iterations, denoted by step 20 and step 21, respectively, of FIG. 3. The oxide superconductor precursor can be any combination of materials which will yield the desired oxide superconductor upon reaction. In particular, it may be a metallic alloy containing the metallic constituents of the desired oxide superconductor and optionally containing silver. Alternatively, the constituent simple metal oxides, mixed metal oxides, metal salts and even intermediate oxide superconductors of the desired oxide superconductor may be used as a precursor. The precursor may optionally be mixed with a matrix metal, such as silver, and/or may be sheathed in a matrix material in a powder-in-tube configuration.

The heat treatment 20 of the heat treatment/deformation iteration serves two purposes in the process. Firstly, the anneal is sufficient to form an oxide superconductor and results typically in a mixture of superconducting and secondary phases. "Secondary phases" include sub-oxide or non-superconducting oxide species which require further processing to form an oxide superconductor phase. BSCCO-2212 is often the intermediate oxide superconductor because it is readily textured during mechanical deformation. BSCCO-2223 is the typical desired oxide superconducting phase because of its high critical temperature. Secondly, the heat treatment promotes reaction-induced texture.

The deformation 21 of the article promotes deformation-induced texture. One or more iterations can be performed. FIG. 3 shows two first heat treatment/deformation iterations, by way of example. If more than one iteration is performed, both conversion to the superconducting phase and development of texture can be done in incremental stages.

If the desired oxide superconductor is not formed in the first heat treatment/deformation iterations, the second step of the process may consist of one or more second heat treatment/deformation iterations to form the desired oxide superconductor and to further texture the oxide superconductor phase. The article is heated in a step indicated by 22 whereby the desired oxide superconductor is formed and reaction-induced texture can occur. Secondary phases react with BSCCO-2212 to form the desired oxide superconductor, BSCCO-2223. The article is deformed in a subsequent step indicated by 23, whereby deformation-induced texture can occur. If more than one iteration is used, only a portion of the intermediate oxide superconductor, need be converted into the desired oxide superconductor with each iteration. Conditions known to form intermediate and desired oxide superconductors are well known in the art. Suitable conditions are described in Sandhage, et al. *JOM*, 21 (March 1991), hereby incorporated by reference.

Practically, the incremental improvement in alignment for both anneal/deformation cycles will decrease markedly after several iterations, however, there is no theoretical limit to the number of iterations that can be used. The strain introduced in the deformation step can range up to 99%. The strains applied in each deformation/anneal iteration may be constant or they may be changed for each subsequent iteration. It is particularly desirable in some embodiments, to use decreasing strains with each subsequent iteration.

It is also possible to adjust the processing conditions to promote partial melting during the heating step 20 or 22 of the heat treatment/deformation iterations, indicated by step 24, to assist in grain growth and enhance reaction kinetics (reaction-induced texture). Heating in the range of 820–835° C. in 0.075 atm $O_2$ and 1 atm total pressure for 0.1 to 100 hours is typical for partial melting to occur.

The final part of the process consists of a two-step heat treatment in which (a) the article is processed to form a liquid phase which co-exists with the desired oxide superconductor followed by (b) processing of the article under conditions that favor the formation of the desired oxide superconductor phase. Thus, step (b) of the two-step heat treatment is designed to promote conversion of the non-"desired oxide superconductor into the desired oxide superconductor. This process has been described in greater detail, above.

The oxide superconductors which make up the oxide superconductor articles of the present invention are brittle and typically would not survive a mechanical deformation process, such as rolling or pressing. For this reason, the oxide superconductors of the present invention are typically processed as a composite material including a malleable matrix material. In particular, silver is preferred as the matrix material because of its cost, nobility and malleability. The oxide superconductor composite may be processed in any shape, however, the form of wires, tapes, rings or coils are particularly preferred. The oxide superconductor may be encased in a silver sheath, in a version of the powder-in-tube technology. The oxide superconductor can take the form of multiple filaments embedded within a silver matrix. For further information on superconducting tapes and wires; see, Sandhage et al.

II. LOW PRESSURE, LOW TEMPERATURE ANNEAL

The present invention may also call for a low temperature, low pressure annealing treatment after formation of a BSCCO-2223 oxide superconductor phase. The anneal is carried out in a low temperature, low pressure region which is within the phase stability region for BSCCO-2223. The phase stability region is that range of processing conditions for which BSCCO-2223 is a thermodynamically stable phase. Both oxygen pressure and temperature are known to be important (but not exclusive) processing parameters in determining the phase stability range of BSCCO-2223. The applicants have surprisingly discovered that an anneal of the BSCCO-2223 oxide superconductor according to the invention provides significant improvements in electrical properties, in particular, $T_c$, $I_c$ and $J_c$. Improvements of up to 10%, 20% 30% and even up to 50% in critical current upon annealing according to the invention has been observed. Bulk zero resistivity above 111.0 K after anneal also has been observed.

The low temperature, low pressure anneal of the present invention is particularly directed to $Bi_{2-y}Pb_ySr_2Ca_2Cu_3O_{10+x}$, where $0 \leq x \leq 1.5$ and $0 \leq y \leq 0.6$. As is well known in the art, stated stoichiometries are all approximate. Intentional and unintentional variations in composition are contemplated within the scope of the invention. It is also well known in the art to partially substitute one or more of the elements making up the oxide superconductor. In a particular embodiment, lead is substituted for between zero and thirty percent of the bismuth. Such partial substitution of elements of the $Bi_2Sr_2Ca_2Cu_3O_{10+x}$, oxide superconductor are contemplated within the scope of the invention and are considered represented within the notation "BSCCO-2223" used to describe the composition.

The low pressure, low temperature anneal of the invention is effective to improve $T_c$, and $J_c$ of any BSCCO-2223 article regardless of the process used to form the oxide superconducting phase. The BSCCO-2223 phase can be prepared from any conventional method, including by way of example only, solid state reaction of metal oxides, reaction of metal-organic precursors, oxidation of metallic precursors and thin film deposition and reaction processes. Additionally, the article can be textured by any conventional method to induce orientation of the oxide superconductor grains (texturing). By way of example only, the article may be processed by zone-refined melt growth techniques and mechanical deformation such as pressing and rolling, as described hereinabove. The two-step heat treatment of the invention is preferably used in conjunction with the low pressure, low temperature anneal to obtain superior results.

Additional superconducting and non-superconducting phases can be included in the article, so long as they do not interfere with the superconducting properties of BSCCO-2223. By way of example only, other superconducting phases may include BSCCO-2212. By way of example only, non-superconducting phases may include noble metals which add ductility and formability to the superconducting article. Noble metals include silver and gold; silver is a preferred noble metal. The article may be a multifilamentary oxide superconductor in a silver matrix as described hereinabove.

The anneal of the invention is most effective when carried out as the final processing step in the preparation of the oxide superconducting article. That is, the formation and texturing of the BSCCO-2223 phase should be optimized before annealing the article using the low pressure, low temperature anneal of the invention. The invention recognizes that additional post-processing thermal treatments may be required in the preparation of a usable article (for example, insulation of the superconducting article). Those steps are to be considered separate from the preparation of the oxide superconductor, for which the annealing of the present invention is preferably the final processing step.

Figure 4:
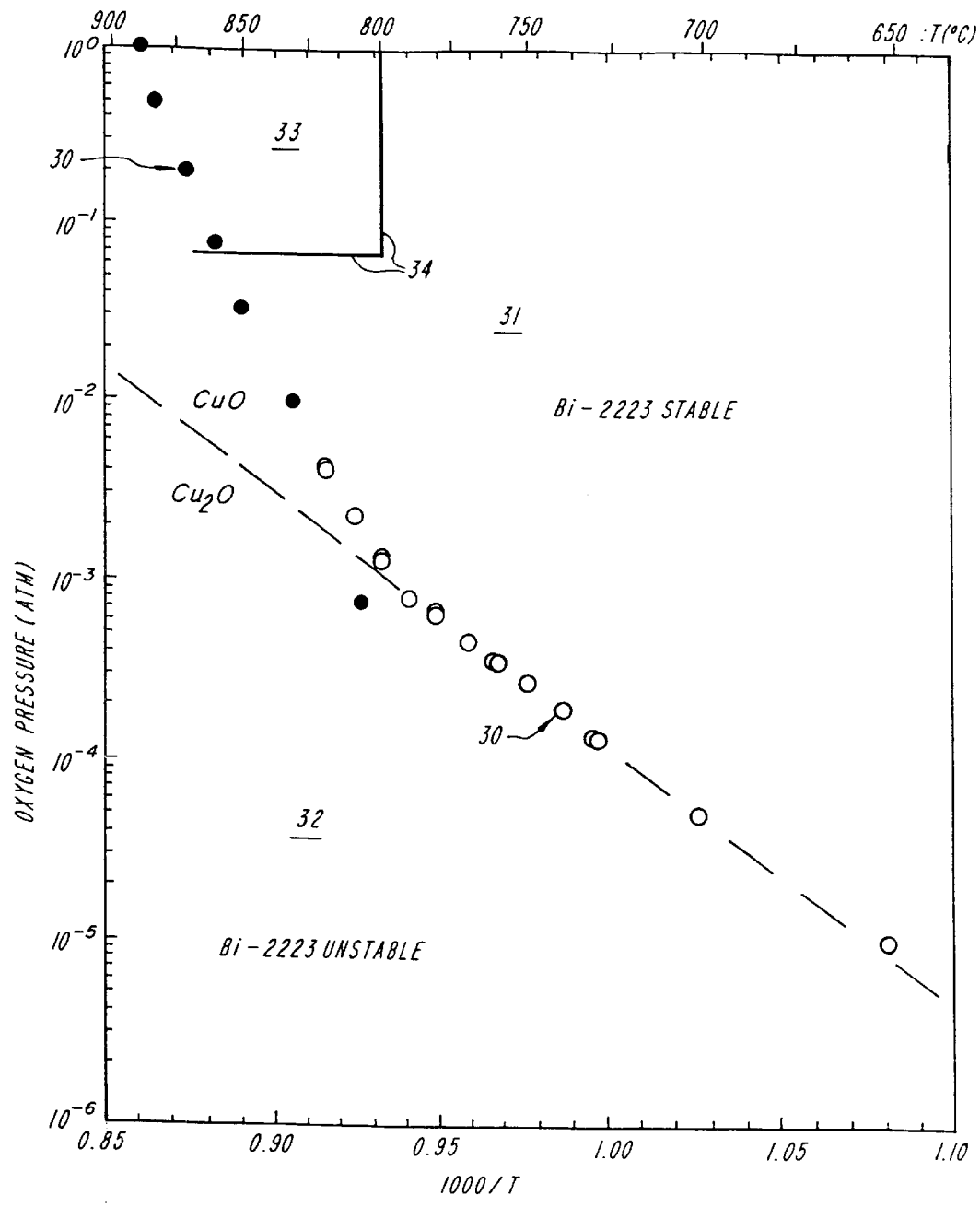
FIG. 4 is a prior art Van't Hoff diagram for BSCCO-2223.

FIG. 4 shows a prior art phase stability diagram for BSCCO-2223 as a function of oxygen pressure and temperature, which is taken from Rubin et al. (*J. Appl. Phys. Lett.* 61(16), 1977 (1992)). The region 31 above a line 30 (indicated with closed and open circles) defines the temperature and oxygen pressure conditions at which the BSCCO-2223 phase is stable. The region 32 below line 30 defines the temperature and oxygen pressures at which the BSCCO-2223 phase is unstable. The majority of the prior art processing of BSCCO-2223 is carried out under conditions defined by the smaller region 33 in the upper left hand corner of the diagram bounded by the line 30 and lines 34.

Figure 5:
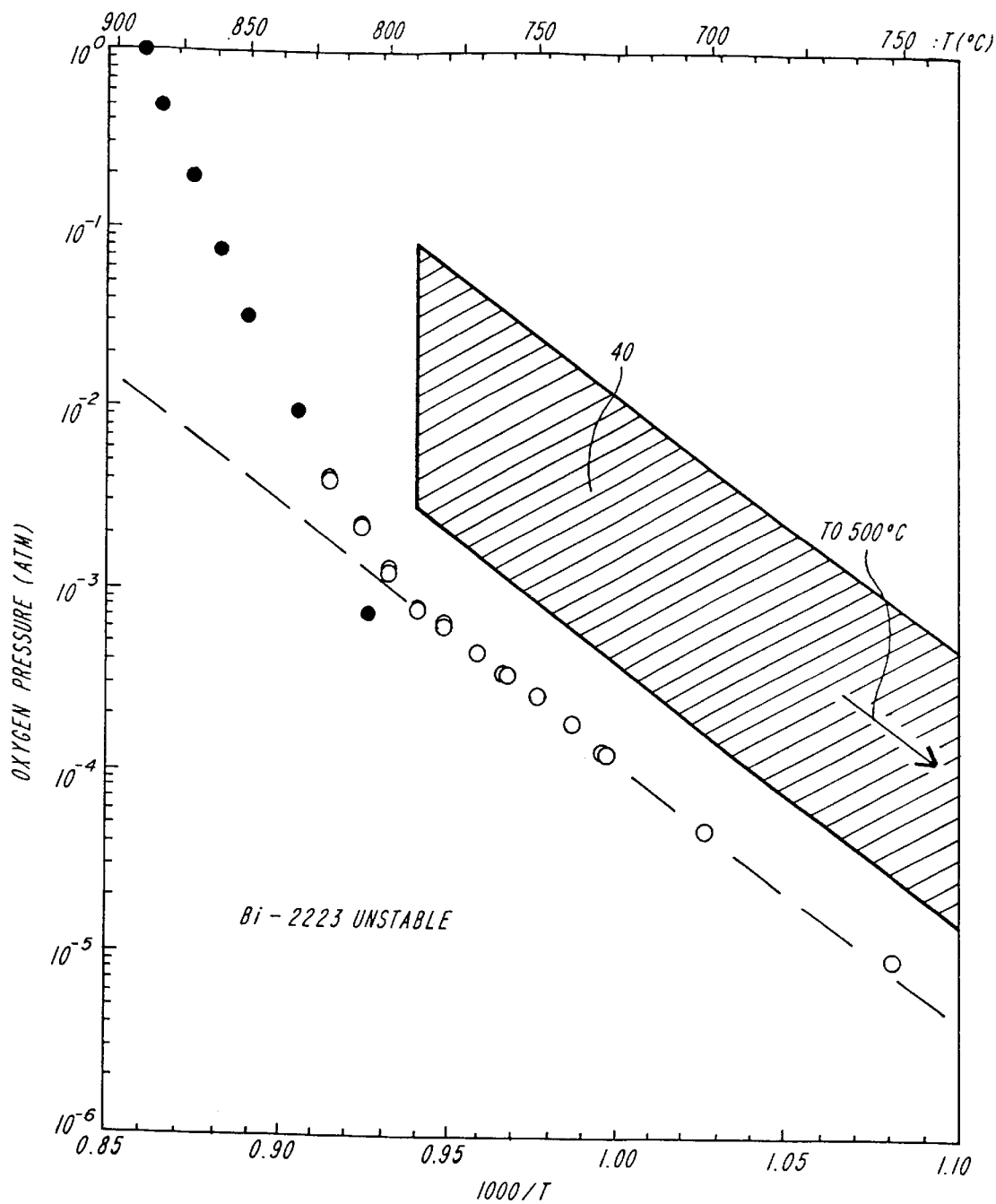
FIG. 5 is a phase stability limit diagram for BSCCO-2223 indicating the low pressure, low temperature anneal conditions of the present invention.

The applicants have surprisingly discovered that the critical current and critical transition temperature of the BSCCO-2223 oxide superconductor can be improved by annealing the BSCCO-2223 phase under conditions defined by a hatched region 40 in FIG. 5. The annealing range lies above and roughly parallel to the published stability boundary; however, there also exists an upper boundary, above which superconducting properties will diminish. This region is satisfied by the following 25 equations (for T (° C.) and $P_{O2}$ (atm)):

(1) $500°\ C. \leq T \leq 787°\ C.$;

(2) $P_{O2} \geq 3.5 \times 10^{10} \exp(-32,000/(T+273))$ is the lower bound; and (3) $P_{O2} \leq 1.1 \times 10^{12} \exp(-32,000/(T+273))$ is the upper bound.

The vertices of the parallelogram defining region 40 are defined by the following coordinates [T(° C.), $P_{O2}$(atm)]: (787, 0.09); (787, 0.003); (500, $1.13 \times 10^{-6}$); and (500, $3.7 \times 10^{-8}$), which represent the corner bounds for temperature and pressure conditions. The anneal is preferably applied under conditions close to, but not exceeding, the upper boundary of region 40. While approaching the upper bound, the temperature is preferably as low as kinetically and practically possible.

Figure 6:
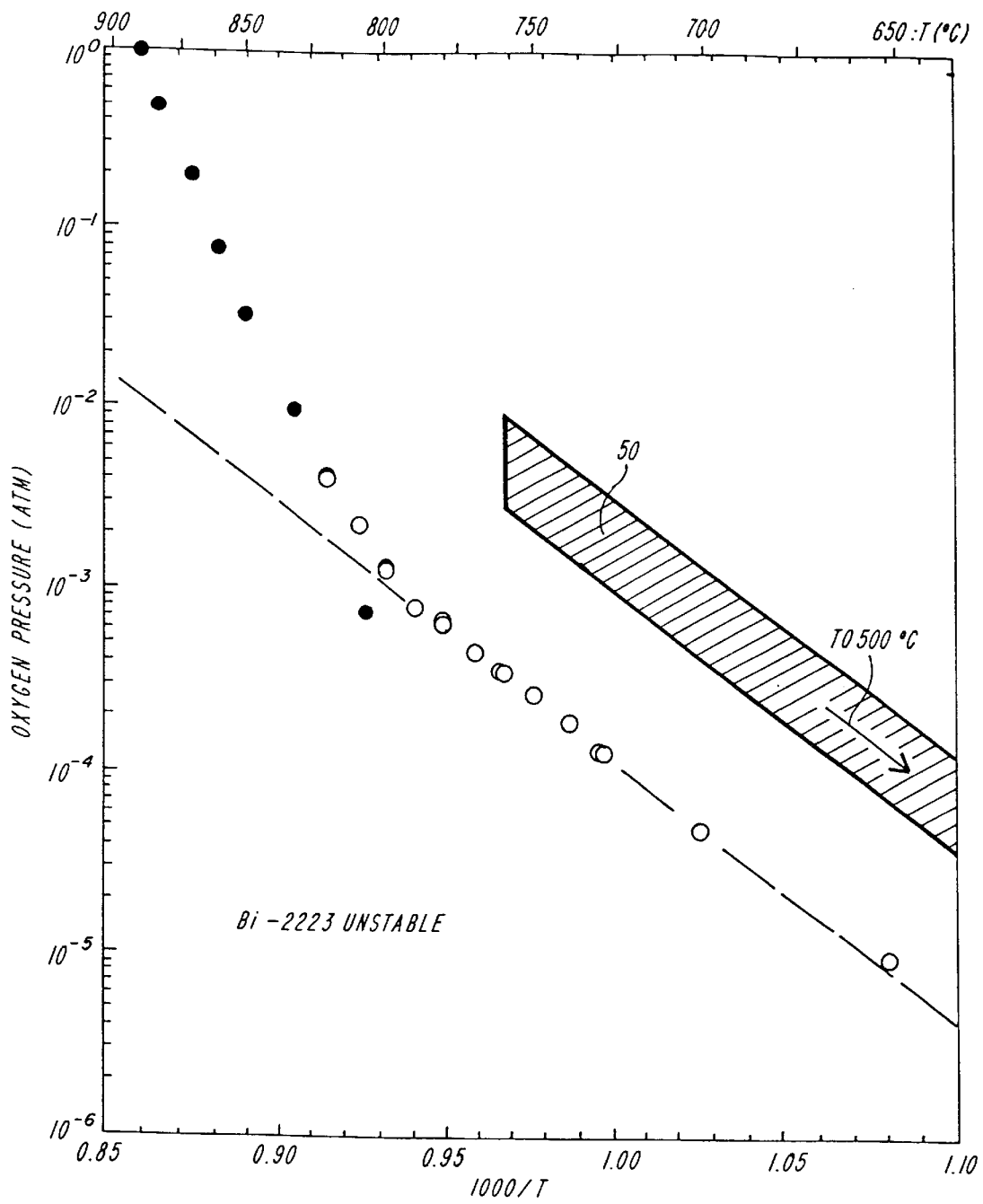
FIG. 6 is a phase stability limit diagram for BSCCO-2223 indicating the low pressure, low temperature anneal conditions of the present invention.

With reference to the phase diagram of FIG. 6, the BSCCO-2223 phase is most beneficially annealed under conditions defined by a hatched region 50. The annealing range lies parallel and closely approaches the upper boundary of the annealing conditions. This region is satisfied by the following equations (for T (° C.) and $P_{O2}$ (atm)):

(1) $500°\ C. \leq T \leq 760°\ C.$;

(2) $P_{O2} \geq 8.5 \times 10^{10} \exp(-32,000/(T+273))$ is the lower bound; and (3) $P_{O2} \leq 2.62 \times 10^{11} \exp(-32,000/(T+273))$ is the upper bound.

The vertices of the parallelogram defining region 50 are defined by the following coordinates [T(° C), $P_{O2}$(atin)]: (760, 0.0092); (760, 0.003); (500, $2.8 \times 10^{-7}$); and (500, $9.0 \times 10^{-8}$), which represent the corner bounds for temperature and pressure conditions for region 50. The conditions of regions 50 are particularly well-suited to improve critical current and critical transition temperature of the oxide superconductor.

The oxygen pressures of the invention are carefully controlled by maintaining a total annealing atmosphere at substantially one atmosphere. The annealing atmosphere includes an inert gas such as argon or nitrogen. The inert gas is mixed with a precisely controlled amount of oxygen to obtain the desired total oxygen pressure. This gas is continuously introduced above the oxide superconductor article during anneal. Hence, the annealing atmosphere remains essentially constant, since any changes in oxygen composition due to outgassing from the sample are mitigated by the flow of annealing atmosphere over the sample.

The oxide superconductor is annealed for a time sufficient to effect the improvements in electrical properties of the present invention. The annealing time is a function of the anneal temperature and the size of the superconducting article. Annealing time increases as temperature decreases and hence poses a limit to anneal temperatures which can be practically applied. At 660° C., greater than 150 hours anneal time are required. If the superconducting article is sufficiently thin, then the annealing time decreases and the anneal may be practically applied for temperatures as low as 500° C. Anneal times typically range from 5 to 300 hours.

In preferred embodiments, the temperature is in the range of 770–787° C. and the oxygen pressure is in the range of 0.017–0.085 atm; or the temperature is in the range of 750–770° C. and the oxygen pressure is in the range of 0.0009–0.052 atm; or the temperature is in the range of 730–750° C. and the oxygen pressure is in the range of 0.005–0.029 atm; or the temperature is in the range of 690–730° C. and the oxygen pressure is in the range of 0.0001–0.015 atm. In more preferred embodiments, the temperature is in the range of 740–760° C. and the oxygen pressure is in the range of 0.0016–0.009 atm; or the temperature is in the range of 710–740° C. and the oxygen pressure is in the range of 0.0006–0.005 atm; or the temperature is in the range of 690–710° C. and the oxygen pressure is in the range of 0.0003–0.002 atm.

The annealing step can take the form of a single anneal at temperatures and oxygen pressures within the annealing regions defined by region 40 and 50 in FIGS. 5 and 6, respectively. Additional benefits to the electrical properties of the BSCCO-2223 article are observed when the annealing step includes application of progressively lower temperatures and/or oxygen pressures. In one preferred embodiment, the anneal may comprise two or more discrete "bakes" at progressively lower temperatures and oxygen pressures. In another preferred embodiment, the anneal may comprise continuous slow temperature reduction of the superconducting article while oxygen pressure is either continuously or stepwise decreased. In yet another preferred embodiment, the anneal may also comprise continuous decrease of oxygen pressure while the temperature is stepwise decreased. A particularly preferred embodiment includes treating the oxide superconductor by a stepwise or continuous reduction in temperature and oxygen pressure from 787° C. at 0.075 atm oxygen to temperatures in the range of 730° C. to 690° C. at 0.003 to 0.0003 atm oxygen. A prior anneal at 787° C. and 0.075 atm oxygen is preferably carried out. At all times, however, the anneal must remain within the proscribed regions of either 40 or 50.

The method of approaching the low temperature, low oxygen pressure conditions of the anneal of the present invention is also a factor in the process. In preferred embodiments, the decrease in temperature and oxygen pressure are synchronized and gradual. An oxide superconductor article which has been formed at higher temperatures and oxygen pressures (as is typically the case) will retain an internal oxygen potential at the elevate prior processing levels until diffusion permits the internal oxygen content to accommodate the external change. If the article is rapidly subjected to low temperature, low $P_{O2}$ conditions, the BSCCO-2223 oxide superconductor may undergo irreversible decomposition because the internal high oxygen potential of the article results in internal reaction conditions that are outside the upper boundary for oxygen pressure as defined by the present invention. By slowly changing the temperature and oxygen pressure conditions, the internal conditions are allowed to adapt to the changing external conditions and remain within the anneal region of the present invention.

It is not certain what is the source of the improved critical current performance in the low pressure, low temperature anneal of the present invention. It has been suggested that oxygen stoichiometry is optimized by the long anneal times at low oxygen pressure and temperature. Alternatively, is may be that grain growth is optimized and the number of grain boundaries is reduced, thereby facilitating unimpeded current flow. An interesting possibility is the formation of a new oxide superconductor phase by atomic diffusion into the solid state structure of BSCCO-2223.

The annealing of the present invention has been found to be particularly effective when used in conjunction with the two-step final heat treatment described above. The two-step heat treatment for BSCCO-2223 includes heating the article at a temperature substantially in the range of 815° C. to 860° C. for a period of time substantially in the range of 0.1 to 300 h at a $P_{O2}$ substantially in the range of 0.001–1.0 atm and followed by reducing the article to a temperature substantially in the range of 790° C. to 845° C. for a period of time substantially in the range of 1 to 300 hours at a $P_{O2}$ substantially in the range of 0.01 to 1.0 atm. The reader is referred to "I. Two-Step Heat Treatment" of the Description of the Preferred Embodiment, above, for further discussion of the two-step heat treatment.

II. EXAMPLES OF THE PREFERRED EMBODIMENT

The examples below describe the two-step heat treatment and the anneal step of the present invention. The anneal is used in conjunction with the two-step heat treatment; however, it can be used on BSCCO-2223 oxide superconductor prepared by any conventional process. The $J_c$ obtained from samples subjected to the two-step heat treatment show significant improvements over prior art materials. Even further improvements in $J_c$ are observed by subjecting an oxide superconductor article obtained from the two-step heat treatment process to a low pressure, low temperature anneal.

Example 1

The following example compares the transport critical current characteristics of a samples treated with the two-step heat treatment of the present invention to those of conventionally processed samples.

Precursor powders were prepared from the solid state reaction of freeze-dried precursor of the appropriate metal nitrates having the nominal composition of 1.7:0.3:1.9:2.0:3.1 (Bi:Pb:Sr:Ca:Cu). $Bi_2O_3$, $CaCO_3$, $SrCO_3$, $Pb_3O_4$ and CuO powders could be equally used. After thoroughly mixing the powders in the appropriate ratio, a multistep treatment (typically, 3–4 steps) of calcination (800° C.±10° C., for a total of 15 h) and intermediate grinding was performed in order to remove residual carbon, homogenize the material and to generate the low $T_c$ BSCCO-2212 oxide superconductor phase. The powders were packed into silver sheaths having an inner diameter of 0.625" (1.5875 cm) and a length of 5.5" (13.97 cm) and a wall thickness of 0.150" (0.38 cm) to form a billet.

The billets were extruded to a diameter of ¼" (0.63 cm). The billet diameter was narrowed with multiple die passes, with a final pass drawn through a 0.070" (0.178 cm) hexagonally shaped die into silver/oxide superconductor hexagonal wires. Nineteen of the wires were bundled together and drawn through a 0.070" (0.178 cm) round die to form a multifilamentary round wire. The round wire was rolled to form a 0.009"×0.100" (0.023 cm×0.24 cm) multifilamentary tape.

A length of the composite tape was then subjected to a heat treatment according to the invention. The composite tape was heated in a furnace in a first heat treatment at 820° C. in 0.075 atm $O_2$ for 48 h. The first heat treatment formed significant amounts of the desired oxide superconductor phase, BSCCO-2223. The composite tape was then rolled to reduce thickness by 11% (0.009" to 0.008"). Lastly, the rolled composite tape was subjected to a two-step heat treatment, namely, heating from room temperature at a rate of 1° C./min to 820° C. in 0.075 atm $O_2$ and holding for 54 h, cooling to 810° C. in 0.075 atm $O_2$ and holding for 30 h. The sample was furnace cooled to room temperature in 1 atm $P_{O2}$.

A comparable length of composite tape was subjected to a conventional heat treatment. The composite tape was heated in a furnace in a first heat treatment at 820° C. in 0.075 atm $O_2$ for 48 h. The first heat treatment caused significant amounts of the desired oxide superconductor phase, BSCCO-2223 to form. The composite tape was then rolled to reduce thickness by 11% (0.009" to 0.008"). The control samples were then subjected to a second heat treatment at 810° C. in 0.075 atm $O_2$ for 84 h. This was a single step heat treatment in which no melting of the sample occurs. The microstructure of the samples were evaluated under an optical microscope. The samples prepared according to the method of the invention had a higher density and far less cracks than the control samples.

The critical currents of the samples using a criterion of 1 µV/cm, 77-K and zero applied field were determined. A single critical current was determined end-to-end over a long length of tape (7–10 m). Critical current for a number of 10 cm lengths of composite tapes were determined and an average value was determined. Critical current ($I_c$, in A) is related to the critical current density ($J_c$ in A/cm²) by the relationship, $J_c=1{,}250 \cdot I_c$. The results are reported in Table 1 and show that samples processed according to the method of the invention exhibited a factor of at least two improvement in critical transport properties.

TABLE 1

A comparative study of the method of the invention with a conventional process.

| sample no. | length (m) | $I_c$ (A) | % σ | $J_c$ (A/cm²) |
|---|---|---|---|---|
| Example 1-1 | 10 | 6.05 | — | 7563 |
| Example 1-2 | 0.1 | 9.52 | 13 | 11,900 |
| Control 1-1 | 7 | 2.23 | — | 2788 |
| Control 1-2 | 0.1 | 4.08 | 16 | 5100 |

Example 2

This example demonstrates that silver alloys can be used in place of silver for the silver billet without detrimental effect on the electrical properties of the composite. A composite tape is prepared as described in Example 1; however, a silver alloy containing low levels of Mg and Ni was used to sheathe the oxide superconductor. The tape was processed as in Example 1 according to the method of the invention. The average $I_c$ (77K, 10 cm) was 7.68 A as compared to ca. 4.08 A for a conventional process.

Example 3

This example compares samples which have been pressed or rolled as the intermediate deformation.

Composite tapes were prepared as described in Example 1. A statistically designed experiment was performed using the following process parameters for the first anneal and final heat treatments.

| | | two-step heat treatment | | | |
|---|---|---|---|---|---|
| first heat treatment | | high temperature | | low temperature | |
| T(° C.) | t(h) | T(° C.) | t(h) | T(° C.) | t(h) |
| − 820 | 12 | − 820 | 12 | − 810 | 36 |
| 0 827 | 24 | 0 827 | 24 | 0 815 | 54 |
| + 835 | 48 | + 835 | 48 | + 815 | 72 |

Up to sixty four statistically selected combinations of reaction conditions were run both with and without the two-step heat treatment of the invention. The intermediate deformation step between the first heat treatment and two-step heat treatment consisted of a pressing with 12% strain reduction.

Comparable statistically designed experiments were carried out for rolled samples with and without the two-step heat treatment of the invention. The intermediate deformation step between the first and two-step heat treatment consisted of rolling with 12% strain reduction. Critical currents (77 K, OT) were measured across 1 cm. The results are reported in Table 2.

TABLE 2

Comparison of pressed and rolled composite tapes.

| sample no. | deformation treatment | second heat treatment | n | $I_c$(σ) (A) | $J_c$ (A/cm²) |
|---|---|---|---|---|---|
| 3-1 | press | two step | 60 | 10.63 (2.43) | 13,288 |
| 3-2 | press | one step | 6 | 9.45 (0.20) | 11,812 |
| 3-3 | roll | two step | 60 | 11.71 (1.09) | 14,638 |
| 3-4 | roll | one step | 64 | 3.41 (0.77) | 4,263 |

The results found in Table 2 show that both pressed and rolled samples benefitted from the two-step heat treatment of the invention. The benefit is greater for rolled samples because rolling results in microcracking perpendicular to the direction of current flow, which is the most deleterious to transport critical current and the most responsive to the healing effect of the present invention.

Example 4

This example shows the effect of the number of heat treatment/deformation iterations on critical transport properties of the samples.

Ten meter lengths of composite tape were prepared as described for Example 1. The composite tapes were heated in a furnace in a first heat treatment at 815° C. in 0.075 atm $O_2$ for 48 h. The composite tapes were then rolled to reduce thickness by 12%. The above heat treat and deform iteration was carried out for x=2, x=3 and x=4 iterations on three samples, respectively. Lastly, the deformed composite tapes were subjected to a two-step heat treatment according to the invention, namely, heating at 824° C. in 0.075 atmn $O_2$ for 54 h, followed by heating at 815° C. in 0.075 atm $O_2$ for 30 h. The final thickness for each tape was 0.0080" (0.020 cm). The critical transport measurements for the three samples are given in Table 3. All samples exhibited critical currents higher than that of the control sample (3 A). In this series of samples, the incremental improvement to critical current was maximized at n=3; however, dependent upon the particular experimental conditions, it may be desirable to perform more or less iterations.

TABLE 3

Effect of Iteration Number on Critical Transport

| sample no. | x | $I_c$ (A) | $J_c$ (A/cm$^2$) |
|---|---|---|---|
| 4-1 | 2 | 6.35 | 7938 |
| 4-2 | 3 | 7.83 | 9788 |
| 4-3 | 4 | 6.98 | 8725 |

Example 5

The affect of precursor powder stoichiometry was investigated. Composite tapes were prepared as described in Example 1, with the following exception. Powders of different stoichiometry were used in the preparation the composite tapes.

Powder A: 1.8:0.4:2.0:2.2:3 Bi:Pb:Sr:Ca:Cu
Powder B: 1.7:0.3:1.9:2.0:3.1 Bi:Pb:Sr:Ca:Cu The composite tapes prepared from powders A and B were subjected to the following heat treatment/deformation cycle:

| | |
|---|---|
| (1) heat treatment: | 815° C., 0.075 atm $O_2$, 48 h |
| (2) deformation: | roll, 12% strain |
| (3) heat treatment: | 815° C., 0.075 atm $O_2$, 48 h |
| (4) deformation: | roll, 12% strain |
| (5) two step heat treatment as described in Example 4 | |

The final thickness of the tapes was 0.008" (0.020 cm). Critical current measurements are reported in Table 4.

TABLE 4

Effect of sample composition on critical current.

| | | 60 m length | | 10 cm lengths | |
|---|---|---|---|---|---|
| sample no. | powder | $I_c$ (A) | $J_c$ (A/cm$^2$) | $I_c(\sigma)$ (A) | $J_c$ (A/cm$^2$) |
| 5-1 | A | 8.44 | 7,174 | 11.8 (1.3) | 10,030 |
| 5-2 | B | 10.4 | 8,840 | 11.1 (1.2) | 9,435 |

Example 6

A composite tape was prepared according to the processed described in Example 1. The composite tape having a length of 44 m was subjected to an heat treatment/deformation iteration comprised of heating at 815° C. for 48 h under 0.075 atm $O_2$ and an 18% rolling deformation. The iteration was repeated three times. The two-step heat treatment consisted of heating at 824° C. for 96 h (0.075 $P_{O2}$), followed by heating at 815° C. for 30 h (0.075 $P_{O2}$) The sample had a materials $J_c$ measurement of greater than 17, 000 A/cm$^2$ (77 K, self field).

Example 7

This example illustrates the improved critical current for articles prepared according to the low pressure, low temperature anneal of the present invention.

A BSCCO-2223 oxide superconducting article is prepared using the "metallic precursor" process (MP). Bi—Pb—Ca—Sr—Cu—Ag alloys are made by mechanical alloying of the metallic elements in stoichiometric proportions of 1.84:0.34:1.85:2.01:3.5 Bi:Pb:Sr:Ca:Cu with 64 wt % silver. The precursor metallic alloy is fabricated into a multifilament metallic precursor-silver composites tape as described in Example 1, above. The tape contains 361 precursor filaments in a silver matrix. The composite tape is oxidized in oxygen at approx. 400° C. for 150 to 400 hours to convert the metallic precursor into simple and complex metal oxides ("suboxides"). The suboxides are then reacted at 760 to 800° C. (0.075 atm $P_{O2}$, 1–20 hr) to form BSCCO-2212 and remaining reactants necessary to form BSCCO-2223. Deformation by rolling having a total strain in the range of 60 to 90% are used to texture the BSCCO-2212 phase, as described in Example 1, above. BSCCO-2212 is converted to BSCCO-2223 as described above and in Example 1. Specifically, the composite tape is heated at 830° C. for 40 hours in air, followed by roll deformation at ambient to approx. 16% strain, followed by the two-step heat treatment of heating at 830° C. in 0.075 atm oxygen (balance argon for a total pressure of one atmosphere) for 40 hours and heating at 811 C for 120 hours.

Other samples may be prepared using the oxide powder in tube method (OPIT), according to Example 1.

After formation of the BSCCO-2223 phase according to the above methods (or other conventional methods), the temperature is lowered at 4° C./min to 787° C. Oxygen pressure is maintained at 0.075 atm and total pressure is one atmosphere (balance of atmosphere is argon). The oxide superconductor composite is heated at 787° C. for 30 hours. The furnace atmosphere is maintained at the desired composition by carefully mixing argon with the proper amount of oxygen to attain an oxygen concentration of 0.075 atm. The gas mixture flows through the furnace and over the sample during the heat treatment.

Critical current is measure as described in Example 1 across a 1 cm length. Critical current ($I_c$) increased from a 4.5 A pre-anneal value to a 5.5 A post-anneal value for a single sample. (Critical current can be readily converted to critical current density by division or the area, which is typically approximately a factor of 0.00077 cm Example 8

Example 8 shows the additional benefit to electrical properties when an article is subjected to anneal at successively lower temperatures and oxygen pressures.

An oxide superconductor composite is prepared according to Example 7, including a low pressure, low temperature anneal at 787° C. and 0.075 atm $O_2$. The oxide superconductor composite is then subjected to an additional low temperature, low $P_{O2}$ treatment. In a typical procedure, the sample is reduced in temperature at 2° C./min from 787 C to the target lower temperature, which ranges as low as 724° C. in this example. The furnace atmosphere is maintained at the desired composition by carefully mixing argon with the proper amount of oxygen. The gas mixture is introduced into the furnace and passes over the sample during the heat treatment. The gas composition is adjusted with time such that oxygen pressure is approx. 0.01 atm at the start of the period and 0.0035 atm as the target lower temperature is attained. The conditions are then held for 45 hours, followed by cool down at 10° C./min to ambient ($P_{O2}$=0.003).

Figure 7B:
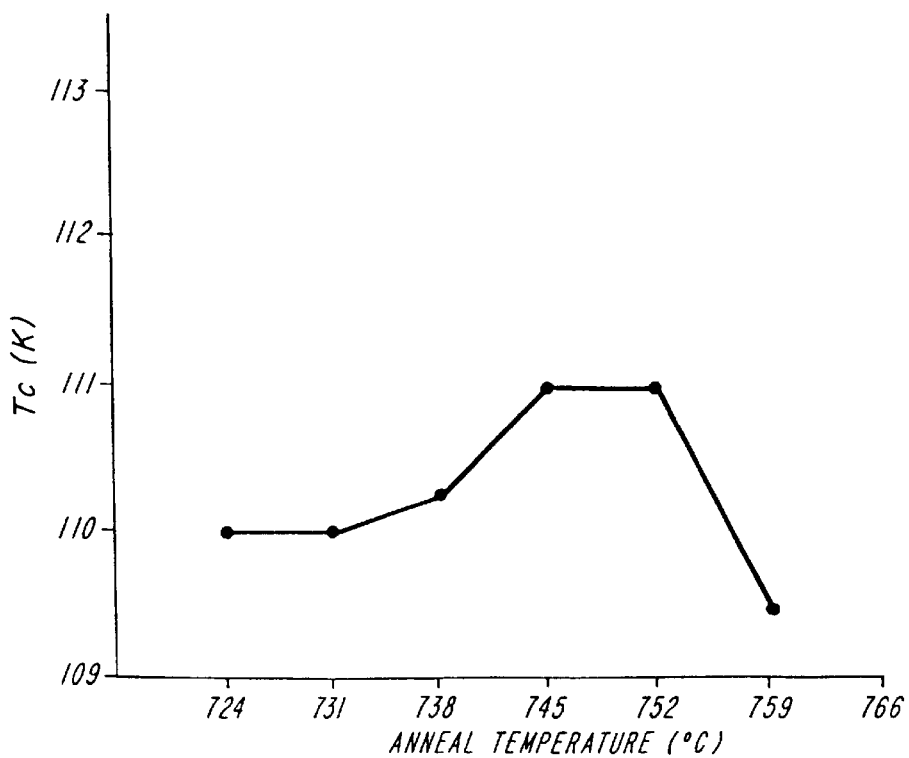
FIG. 7 is a plot of the critical transition temperature and critical current v. anneal temperature for an article subjected to the two-step heat treatment and low pressure, low temperature anneal of the invention.
Figure 7A:
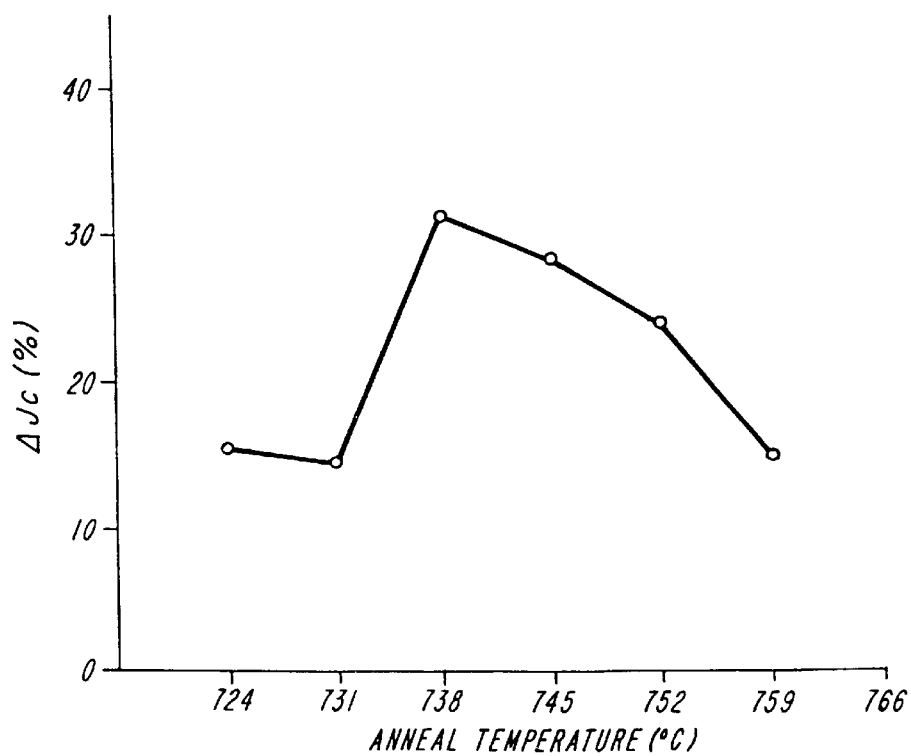

FIG. 7(a) illustrates the improvement in critical current as anneal temperature is decreased. The improvement is shown as the percent increase of critical current density over the critical current observed after the first anneal at 787° C. (0.075 atm $O_2$) shown in Example 7. It is understood that the sample from Example 7 is already an improvement over a conventionally processed material and even over materials processed according to Examples 1–6. Increases of greater than 30% over the critical current observed after the first anneal at 787° C. (0.075 atm $O_2$) shown in Example 7 were observed. The sample shows a steady improvement in critical current density up to 738° C. ($\Delta J_c$=32%), after which the improvement is somewhat lessened. This may represent a kinetic effect of annealing at reduced temperatures. It is expected that improved $J_c$ may be obtained at even lower temperatures with longer anneal times. It is further expected that further reduction in temperature and oxygen pressure (under appropriate reaction times) will result in even greater improvements in critical current density.

FIG. 7(b) illustrates the improvement in critical transition temperature as anneal temperature is decreased. $T_{c, zero}$ as high a 111.1 K were obtained for materials which were annealed at 745–752° C. Critical transition temperature is measured by the standard four probe method which involves placing two voltage taps between two current taps, followed by passing a current through the sample and recording the voltage with changing temperature. The sample is considered to be superconducting with effectively zero resistance when resistance is less than $10^{-8}$ Ω-m. The data presented in FIG. 7(b) represents zero resistance measurements.

Figure 8:
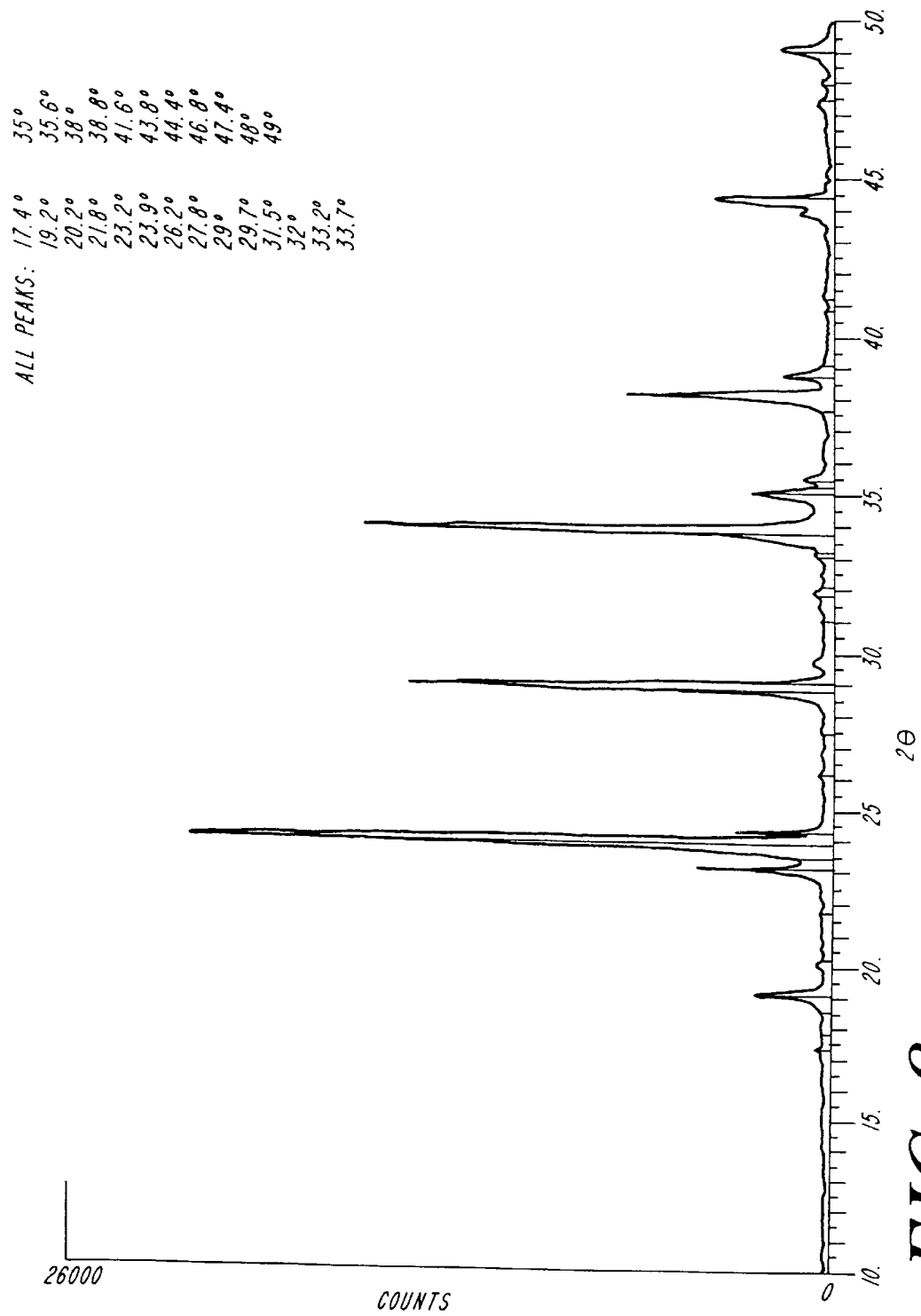
FIG. 8 is an x-ray diffractogram of an article subjected to the two-step heat treatment and low pressure, low temperature anneal of the invention.

X-ray diffraction analysis of a powdered sample obtained according to the method of Example 8, exhibited a unique diffraction pattern. In particular, the diffraction pattern (shown in FIG. 8) contained peaks at 2θ values of 17.4°, 19.2°, 20.2°, 21.8°, 23.2°, 23.9°, 26.2°, 27.8°, 29°, 29.7°, 31.5°, 32°, 33.2°, 33.7°, 35°, 35.6°, 38°, 38.8°, 41.6°, 43.8°, 44.4°, 46.8.°, 47.4°, 48° and 49°. The peak on the diffraction pattern of FIG. 8 represent the peas typically associated with BSF:CC-2223 and additional unidentified peaks. The peaks most typically associated with BSCCO-2223 are 19.2°, 20.2°, 21.8°, 23.2°, 23.9°. 26.2°, 29°, 31.5°, 32°, 33.2°, 33.7°, 35°, 35.6°, 38.8°, 44.4°, 47.4°, 48° and 49°. These new peaks suggest the formation of one or more new oxide superconductor phases.

As can be seen by the above examples, the method of the invention is highly versatile and can be successfully used with a variety of deformation processes, oxide superconductor compositions, silver alloy compositions and processing conditions.

Other embodiments of the invention will be apparent to those skilled in the art from a consideration of the specification or practice of the invention disclosed herein. It is intended that the specification and examples be considered as exemplary only, with the true scope and spirit of the invention being indicate by the following claim.

What is claimed is:

1. A method for preparing a BSCCO 2223 oxide superconducting article, comprising:

(a) exposing an oxide superconductor article to a two-step heat treatment after deformation of the article, the article comprised of at least BSCCO 2223, the heat treatment comprising, (i) heating the article to and maintaining the article at a temperature in the range of 815–860° C. for a period of time in the range of 0.1 to 300 hours at a $P_{O2}$ in the range of 0.001–1.0 atm; and (ii) cooling the article to and holding the article at a temperature in the range of 790–845° C. for a period of time in the range of 1 to 300 hours at a $P_{O2}$ in the range of –0.01–1.0 atm; and (b) annealing the superconducting article at a temperature selected from the range of about 500° C.≦T≦787° C. and an annealing atmosphere having an oxygen pressure selected from within the region having a lower bound defined by the equation, $P_{O2}$(lower)≧3.5×$10^{10}$exp(–32,000/(T+273)) and an upper bound defined by the equation $P_{O2}$(upper)≦1.1×$10^{12}$exp(–32,000/(T+273)), where $P_{O2}$ is expressed in units of atmosphere and T is expressed in units of ° C.

2. The method of claim 1, wherein the heat treatment of step (a) comprises:

(i) heating the article at a temperature in the range of 820–835° C.; and (ii) cooling to and maintaining the article at a temperature in the range of 820–790° C.

3. A method for preparing a BSCCO 2223 oxide superconducting article comprising:

(a) exposing an oxide superconductor article comprised of at least a BSCCO 2223 oxide superconductor phase to a two-step heat treatment after deformation of the article, the heat treatment comprising, (i) heating the article to and maintaining the article at a first temperature and pressure range sufficient to partially melt the article, such that the liquid phase co-exists with the BSCCO 2223 superconductor phase; and (ii) cooling the article to a second temperature and pressure range sufficient to substantially transform the liquid phase into the oxide superconductor, and holding the article in the second temperature and pressure range for a time sufficient to transform the liquid phase into the BSCCO 2223 superconductor phase, (b) annealing the superconducting article at a temperature selected from the range of about 500° C.≦T≦787° C. and an annealing atmosphere having an oxygen pressure selected from within the region having a lower bound defined by the equation, $P_{O2}$(lower)≧3.5×$10^{10}$ exp (–32,000/(T+273)) and an upper bound defined by the equation $P_{O2}$(upper)≦1.1×$10^{12}$ exp (–32,000/(T+273)), where $P_{O2}$ is expressed in units of atmosphere and T is expressed in units of ° C.

4. The method of claim 1 or 3, wherein the anneal is carried out at an oxygen pressure in the range of 7.5×$10^{-2}$ atm to 1×$10^{-8}$ atm $O_2$.

5. The method of claim 1 or 3, wherein the step of annealing the superconductor article comprises annealing at a temperature selected from the range of about 500° C.≦T≦760° C. and an annealing atmosphere having an oxygen pressure selected from within the region having a lower bound defined by the equation, $P_{O2}$(lower)≧8.5×$10^{10}$ exp (–32,000/T)+273) and an upper bound defined by the equation, $P_{O2}$(upper)≦2.62×$10^{11}$ exp (–32,000/T)+273).

6. The method of claim 1 or 3, wherein the step of annealing comprises annealing under temperature and oxygen pressure conditions sufficient to provide at least a 30% increase in critical current density as compared to the critical current density of the pre-anneal oxide superconductor article.

7. The method of claim 1 or 3, wherein the step of annealing is the final annealing to which the superconducting article is subjected.

8. The method of claim 1 or 3, wherein the anneal is carried out at a the temperature in the range of 770 to 787° C. and an oxygen pressure in the range of 0.017 to 0.085 atm.

9. The method of claim 1 or 3, wherein the anneal is carried out at a temperature in the range of 750 to 770° C. and an oxygen pressure in the range of 0.0009 to 0.052 atm.

10. The method of claim 1 or 3, wherein the anneal is carried out at a temperature in the range of 730 to 750° C. and an oxygen pressure range of 0.005 to 0.029 atm.

11. The method of claim 1 or 3, wherein the anneal is carried out at a temperature in the range of 690 to 730° C. and an oxygen pressure in the range of 0.0001–0.015 atm.

12. The method of claim 1 or 3, wherein the anneal is carried out at a temperature in the range of 740 to 760° C. and an oxygen pressure in the range of 0.0016 to 0.009 atm.

13. The method of claim 1 or 3, wherein the anneal is carried out at a temperature in the range of 710 to 740° C. and an oxygen pressure in the range of 0.0006–0.005 atm.

14. The method of claim 1 or 3, wherein the anneal is carried out at a temperature in the range of 690 to 710° C. and an oxygen pressure in the range of 0.0003–0.002 atm.

15. The method of claim 1 or 3, wherein no defect forming deformation occurs after the two step heat treatment of step (a).

16. The method of claim 1 or 3, wherein the step of annealing comprises annealing at progressively lower temperature and oxygen pressure.

17. The method of claim 16, wherein the step of annealing comprises continuously reducing temperature and/or oxygen pressure.

18. The method of claim 16, wherein the step of annealing comprises stepwise reduction of temperature and/or oxygen pressure.

* * * * *

UNITED STATES PATENT AND TRADEMARK OFFICE
CERTIFICATE OF CORRECTION

PATENT NO.   : 6,436,876 B1
DATED        : August 20, 2002
INVENTOR(S)  : Otto et al.

It is certified that error appears in the above-identified patent and that said Letters Patent is hereby corrected as shown below:

Column 22,
Line 64, replace "exp (-32,000/T)+273)" with -- exp (-32,000/(T+273)) --,
Line 65, replace "exp (-32,000/T)+273)" with -- exp (-32,000/(T+273) --.

Column 23,
Line 9, replace "carried out at a the temperature" with -- carried out at a temperature --.

Signed and Sealed this

Fourth Day of February, 2003

JAMES E. ROGAN
*Director of the United States Patent and Trademark Office*